US008141240B2

(12) United States Patent
Hiew et al.

(10) Patent No.: US 8,141,240 B2
(45) Date of Patent: Mar. 27, 2012

(54) MANUFACTURING METHOD FOR MICRO-SD FLASH MEMORY CARD

(75) Inventors: Siew S. Hiew, San Jose, CA (US); Nan Nan, San Jose, CA (US); Paul Hsueh, Concord, CA (US); Abraham C. Ma, Fremont, CA (US); Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 1027 days.

(21) Appl. No.: 11/966,871

(22) Filed: Dec. 28, 2007

(65) Prior Publication Data

US 2008/0145968 A1 Jun. 19, 2008

Related U.S. Application Data

(60) Continuation-in-part of application No. 10/888,282, filed on Jul. 8, 2004, now Pat. No. 7,941,916, and a continuation-in-part of application No. 11/773,830, filed on Jul. 5, 2007, now Pat. No. 7,872,871, which is a continuation-in-part of application No. 11/309,594, filed on Aug. 28, 2006, now Pat. No. 7,383,362, which is a continuation-in-part of application No. 10/707,277, filed on Dec. 2, 2003, now Pat. No. 7,103,684, application No. 11/966,871, which is a continuation-in-part of application No. 10/913,868, filed on Aug. 6, 2004, now Pat. No. 7,264,992, and a continuation-in-part of application No. 11/624,667, filed on Jan. 18, 2007, now abandoned, which is a division of application No. 09/478,720, filed on Jan. 6, 2000, now Pat. No. 7,257,714.

(51) Int. Cl.
*H05K 3/30* (2006.01)
*H05K 3/00* (2006.01)
*H01L 23/00* (2006.01)

(52) U.S. Cl. ............... 29/836; 29/832; 29/834; 29/841; 29/412

(58) Field of Classification Search .................. 29/832, 29/834, 840, 841, 846, 412
See application file for complete search history.

(56) References Cited

U.S. PATENT DOCUMENTS 4,582,985 A    4/1986  Lofberg
(Continued)

FOREIGN PATENT DOCUMENTS

JP    63-163589    7/1988
(Continued)

OTHER PUBLICATIONS

USB FlashCard "Main Body Dimensions", "Top View", "Bottom View" Web pages, Lexar, 2004, 3 pages.

(Continued)

*Primary Examiner* — Derris Banks
*Assistant Examiner* — Kaying Kue
(74) *Attorney, Agent, or Firm* — Bever, Hoffman & Harms, LLP; Patrick T. Bever

(57) ABSTRACT

A method for fabricating MicroSD devices includes forming a PCB panel having multiple PCBs arranged in parallel rows, with each PCB connected to its neighboring PCBs in each row by relatively narrow connecting bridge pieces, and separated from PCBs of adjacent rows by elongated stamped out blank slots. Passive components are attached by conventional surface mount technology (SMT) techniques. IC chips, including a MicroSD controller chip and a flash memory chip, are attached to the PCB by wire bonding or other chip-on-board (COB) technique. A molded housing is then formed over the IC chips and passive components using a mold that prevents formation of plastic on the upper surface of each PCB. The connecting bridge pieces are then cut using using a rotary saw. A front edge chamfer process is then performed.

8 Claims, 15 Drawing Sheets

U.S. PATENT DOCUMENTS

| Patent No. | | Date | Inventor | Ref |
|---|---|---|---|---|
| 4,630,201 | A | 12/1986 | White | |
| 4,766,293 | A | 8/1988 | Boston | |
| 4,926,480 | A | 5/1990 | Chaum | |
| 5,020,105 | A | 5/1991 | Rosen et al. | |
| 5,104,820 | A * | 4/1992 | Go et al. | 438/109 |
| 5,180,901 | A | 1/1993 | Hiramatsu | |
| 5,229,548 | A * | 7/1993 | Wheeler | 174/262 |
| 5,280,527 | A | 1/1994 | Gullman et al. | |
| 5,397,857 | A | 3/1995 | Farquhar et al. | |
| 5,404,485 | A | 4/1995 | Ban | |
| 5,414,597 | A | 5/1995 | Lindland et al. | |
| 5,430,859 | A | 7/1995 | Norman et al. | |
| 5,479,638 | A | 12/1995 | Assar et al. | |
| 5,563,769 | A | 10/1996 | MacGregor | |
| 5,623,552 | A | 4/1997 | Lane | |
| 5,657,537 | A * | 8/1997 | Saia et al. | 29/830 |
| 5,819,398 | A * | 10/1998 | Wakefield | 29/830 |
| 5,835,760 | A | 11/1998 | Harmer | |
| 5,891,483 | A | 4/1999 | Miyajima | |
| 5,913,549 | A * | 6/1999 | Skladany | 29/600 |
| 5,959,541 | A | 9/1999 | DiMaria et al. | |
| 6,000,006 | A | 12/1999 | Bruce et al. | |
| 6,012,636 | A | 1/2000 | Smith | |
| 6,040,622 | A | 3/2000 | Wallace | |
| 6,044,428 | A | 3/2000 | Rayabhari | |
| 6,049,975 | A * | 4/2000 | Clayton | 29/832 |
| 6,069,920 | A | 5/2000 | Schulz et al. | |
| 6,069,970 | A | 5/2000 | Salatino et al. | |
| 6,102,743 | A | 8/2000 | Haffenden et al. | |
| 6,125,192 | A | 9/2000 | Bjorn et al. | |
| 6,148,354 | A | 11/2000 | Ban et al. | |
| 6,166,913 | A | 12/2000 | Fun et al. | |
| 6,193,152 | B1 | 2/2001 | Fernando et al. | |
| D445,096 | S | 7/2001 | Wallace | |
| 6,292,863 | B1 | 9/2001 | Terasaki et al. | |
| 6,297,448 | B1 | 10/2001 | Hara | |
| 6,313,400 | B1 | 11/2001 | Mosquera et al. | |
| 6,321,478 | B1 | 11/2001 | Klebes | |
| D452,690 | S | 1/2002 | Wallace et al. | |
| D452,865 | S | 1/2002 | Wallace et al. | |
| D453,934 | S | 2/2002 | Wallace et al. | |
| 6,381,143 | B1 | 4/2002 | Nakamura | |
| 6,399,906 | B1 | 6/2002 | Sato et al. | |
| 6,410,355 | B1 | 6/2002 | Wallace | |
| 6,438,638 | B1 | 8/2002 | Jones et al. | |
| 6,444,501 | B1 | 9/2002 | Bolken | |
| 6,462,273 | B1 | 10/2002 | Corisis et al. | |
| 6,475,830 | B1 | 11/2002 | Brillhart | |
| 6,527,188 | B1 | 3/2003 | Shobara et al. | |
| 6,547,130 | B1 * | 4/2003 | Shen | 235/380 |
| 6,570,825 | B2 | 5/2003 | Miranda et al. | |
| 6,580,615 | B1 | 6/2003 | Nakanishi et al. | |
| 6,615,404 | B1 | 9/2003 | Garfunkel et al. | |
| 6,618,243 | B1 | 9/2003 | Tirosh | |
| 6,624,005 | B1 | 9/2003 | DiCaprio et al. | |
| 6,634,561 | B1 | 10/2003 | Wallace | |
| 6,671,808 | B1 | 12/2003 | Abbott et al. | |
| 6,676,420 | B1 | 1/2004 | Liu et al. | |
| 6,718,407 | B2 | 4/2004 | Martwick | |
| 6,733,329 | B2 | 5/2004 | Yang | |
| 6,740,964 | B2 | 5/2004 | Sasaki | |
| 6,757,783 | B2 | 6/2004 | Koh | |
| 6,763,410 | B2 | 7/2004 | Yu | |
| 6,773,192 | B1 | 8/2004 | Chao | |
| 6,778,401 | B1 | 8/2004 | Yu et al. | |
| 6,832,281 | B2 | 12/2004 | Jones et al. | |
| 6,854,984 | B1 | 2/2005 | Lee et al. | |
| 6,900,988 | B2 | 5/2005 | Yen | |
| 6,924,547 | B2 | 8/2005 | Kanemoto et al. | |
| 6,940,153 | B2 | 9/2005 | Spencer et al. | |
| 6,944,028 | B1 | 9/2005 | Yu et al. | |
| 7,017,248 | B2 | 3/2006 | Choi et al. | |
| 7,089,661 | B2 | 8/2006 | Fong et al. | |
| 7,103,684 | B2 * | 9/2006 | Chen et al. | 710/62 |
| 7,249,978 | B1 * | 7/2007 | Ni | 439/660 |
| 7,257,714 | B1 * | 8/2007 | Shen | 713/186 |
| 7,264,992 | B2 * | 9/2007 | Hsueh et al. | 438/106 |
| 7,525,807 | B2 * | 4/2009 | Ohta et al. | 361/737 |
| 7,535,088 | B2 * | 5/2009 | Ni et al. | 257/679 |
| 7,608,920 | B2 * | 10/2009 | Wehrly, Jr. | 257/686 |
| 7,855,099 | B2 * | 12/2010 | Ni et al. | 438/106 |
| 7,866,562 | B2 * | 1/2011 | Hiew et al. | 235/492 |
| 7,874,067 | B1 * | 1/2011 | Hiew et al. | 29/832 |
| 2001/0038547 | A1 | 11/2001 | Jigour et al. | |
| 2001/0043174 | A1 | 11/2001 | Jacobsen et al. | |
| 2002/0036922 | A1 | 3/2002 | Roohparvar | |
| 2002/0116668 | A1 | 8/2002 | Chhor et al. | |
| 2002/0166023 | A1 | 11/2002 | Nolan et al. | |
| 2002/0186549 | A1 | 12/2002 | Bolken | |
| 2003/0038043 | A1 | 2/2003 | Painsith | |
| 2003/0046510 | A1 | 3/2003 | North | |
| 2003/0100203 | A1 | 5/2003 | Yen | |
| 2003/0163656 | A1 | 8/2003 | Ganton | |
| 2003/0177300 | A1 | 9/2003 | Lee et al. | |
| 2003/0182528 | A1 | 9/2003 | Ajiro | |
| 2004/0034765 | A1 | 2/2004 | O'Connell | |
| 2004/0066693 | A1 * | 4/2004 | Osako et al. | 365/222 |
| 2004/0087213 | A1 | 5/2004 | Kao | |
| 2004/0137664 | A1 | 7/2004 | Elazar et al. | |
| 2004/0143716 | A1 | 7/2004 | Hong | |
| 2004/0145875 | A1 | 7/2004 | Yu et al. | |
| 2004/0148482 | A1 | 7/2004 | Grundy et al. | |
| 2004/0153595 | A1 | 8/2004 | Sukegawa et al. | |
| 2004/0255054 | A1 | 12/2004 | Pua et al. | |
| 2005/0009388 | A1 | 1/2005 | Chao | |
| 2005/0114587 | A1 | 5/2005 | Chou et al. | |
| 2005/0182858 | A1 | 8/2005 | Lo et al. | |
| 2005/0193161 | A1 | 9/2005 | Lee et al. | |
| 2005/0193162 | A1 | 9/2005 | Chou et al. | |
| 2005/0216624 | A1 | 9/2005 | Deng et al. | |
| 2005/0218200 | A1 | 10/2005 | Focke et al. | |
| 2005/0248926 | A1 | 11/2005 | Asom et al. | |

FOREIGN PATENT DOCUMENTS

| | | |
|---|---|---|
| JP | 02-118790 | 5/1990 |
| JP | 11-039483 | 2/1999 |

OTHER PUBLICATIONS

USB 'A' Plug Form Factor, Revision 0.9, Guideline for Embedded USB Device Applications, Nov. 29, 2004, 4 pages.

\* cited by examiner

MANUFACTURING METHOD FOR MICRO-SD FLASH MEMORY CARD

RELATED APPLICATIONS

This application is a continuation-in-part (CIP) of U.S. patent application for "Manufacturing Method For Memory Card", U.S. application Ser. No. 10/888,282, filed Jul. 8, 2004 now U.S. Pat. No. 7,941,916.

This application is a also a CIP of U.S. patent application for "MOLDING METHODS TO MANUFACTURE SINGLE-CHIP CHIP-ON-BOARD USB DEVICE", U.S. application Ser. No. 11/773,830, filed Jul. 5, 2007, now U.S. Pat. No. 7,872,871, which is a CIP of "Single-Chip Multi-Media Card/Secure Digital (MMC/SD) Controller Reading Power-On Boot Code from Integrated Flash Memory for User Storage", U.S. application Ser. No. 11/309,594, filed Aug. 28, 2006, now U.S. Pat. No. 7,383,362, which is a CIP of "Single-Chip USB Controller Reading Power-On Boot Code from Integrated Flash Memory for User Storage", U.S. application Ser. No. 10/707,277, filed Dec. 2, 2003, now U.S. Pat. No. 7,103,684.

This application is also a CIP of U.S. patent application for "Removable Flash Integrated Memory Module Card and Method of Manufacture" U.S. application Ser. No. 10/913,868, filed Aug. 6, 2004 now U.S. Pat. No. 7,264,992.

This application is also a CIP of U.S. patent application for "Electronic Data Storage Medium with Fingerprint Verification Capability", U.S. application Ser. No. 11/624,667, filed Jan. 18, 2007, now abaondoned which is a divisional of U.S. Patent application for "Electronic Data Storage Medium with Fingerprint Verification Capability", U.S. application Ser. No. 09/478,720 filed Jan. 6, 2000, now U.S. Pat. No. 7,257,714.

FIELD OF THE INVENTION

This invention relates to portable electronic devices, and more particularly to portable electronic devices such as those that utilize the Micro Secure-Digital (MicroSD) specification.

BACKGROUND OF THE INVENTION

A card-type electronic apparatus containing a memory device (e.g., an electrically erasable programmable read-only memory (EEPROM) or "flash" memory chip) and other semiconductor components is referred to as a memory card. Typical memory cards include a printed circuit board assembly (PCBA) mounted or molded inside a protective housing or casing. The PCBA typically includes a printed circuit substrate (referred to herein simply as a "substrate") formed using known printed circuit board fabrication techniques, with the memory device and additional components (e.g., control circuitry, resistors, capacitors, etc.) formed on an upper surface of the substrate (i.e., inside the casing), and one or more rows of contact pads exposed on a lower surface of the substrate. The contact pads are typically aligned in a width direction of the casing, and serve to electrically connect and transmit electrical signals between the memory chip/control circuitry and a card-hosting device (e.g., a computer circuit board or a digital camera). Examples of such portable memory cards include multi media cards (MMC cards), personal computer memory card international association (PC-MCIA) cards. An exemplary MMC card form factor is 24 mm wide, 32 mm long, and 1.4 mm or 1.5 mm thick, and is substantially rectangular except for a chamfer formed in one corner, which defines the front end of the card that is inserted into a card-hosting device. The card's contact pads are exposed on its lower surface of each card near the front end. These and other similar card-like structures are collectively referred to herein as "memory module cards" or simply as "memory cards".

An important aspect of most memory card structures is that they meet size specifications for a given memory card type. In particular, the size of the casing or housing, and more particularly the width and thickness (height) of the casing/housing, must be precisely formed so that the memory card can be received within a corresponding slot (or other docking structure) formed on an associated card-hosting device. For example, using the MMC card specifications mentioned above, each MMC card must meet the specified 24 mm width and 1.4/1.5 mm thickness specifications in order to be usable in devices that support this MMC card type. That is, if the width/thickness specifications of a memory card are too small or too large, then the card can either fail to make the necessary contact pad-to-card-hosting device connections, or fail to fit within the corresponding slot of the associated card-hosting device.

One conventional method for manufacturing memory cards that meet required size specifications includes using a cover or housing that is typically adhesively attached to the PCBA substrate over the semiconductor components. One shortcoming of this approach is that the thickness of such covers is necessarily relatively thick, and therefore takes up a significant amount of the specified memory card thickness (e.g., the 1.4 mm thickness of standard MMC cards). As a result, the choice of memory device and other components mounted used in these memory cards is limited to devices that are relatively thin. In addition, because such covers are fabricated separately and then attached to the substrate using an adhesive, the use of such separate covers increases production and assembly costs, and the covers can become detached from the substrate.

U.S. Pat. No. 6,462,273 discloses a second conventional MMC card fabrication process that avoids the thickness problems associated with separate cover structures by forming a molded casing over the PCBA components. First, the PCBA is assembled using normal practices by forming individual module substrates that are connected to a common carrier, with the material used for the carrier being the same as that of the module substrate. During a subsequent plastic molding process, round shaped rods are utilized for forming notches on the card body. Later, round shape cutters are cutting through the notched areas. If any connecting portion between the module and the carrier is not being cut clean, such that there are remaining silvers attached to the module, the silvers will not exist beyond the notch area and affect the card size specifications. Therefore, the card manufactured by this method has notches on the card body.

A problem with the manufacturing method disclosed in U.S. Pat. No. 6,462,273 is that the resulting memory card includes notches that reduce the usable area of the substrate in the width direction. In addition, portions of the substrate remain exposed in the notches after the carrier separation process, which further limits the use of the substrate in regions adjacent to the notches due to possible contamination and/or damage to the substrate in these regions.

What is needed is a method for producing memory cards that utilizes low-cost molding techniques to form rigid casing over a PCBA that maximizes the usable substrate area and avoids the contamination problems associated with conventional molding techniques.

SUMMARY OF THE INVENTION

The present invention is directed to a method for producing MicroSD devices including a molding method that eliminates the process step of cutting the entire peripheral edge outline (singulation process) of the MicroSD PCBA using laser cutter, water jet knife or mechanical grinding method to singulate individual MicroSD from the molded PCB panel. In particular, the present invention introduces a novel micro-SD PCB panel on which the micro-SD PCBs are connected in rows, with each PCB connected only at its ends by a relatively narrow row connecting bridge piece to adjacent PCBs or to the panel frame, with each row separated from its adjacent row by an elongated stamped out blank slot such that the side edges and portions of each end edge of each micro-SD PCB are exposed. Each micro-SD PCB includes standard (plug) metal contacts that are formed on a first (e.g., upper) surface thereof, and all IC components (e.g., MicroSD controller chip, flash memory chip, etc.) are mounted on the opposite (e.g., lower) surface of the PCB. The panel is then placed into a special plastic molding die such that the upper surface is pressed against a flat bottom surface of the die to prevent plastic formation on the standard metal contacts, and a housing is then molded over the IC components (i.e., over the lower surface of the PCB) that includes a plug section extending opposite to the metal contacts to provide the necessary plug structure thickness, and a handle section that covers the IC components. The molded housing is formed over the side edges of the PCB and over at least a portion of each end edge, thus providing a nearly continuous smooth finish without requiring cutting and/or polishing. After the molding process, the individual PCBAs are singulated using a simplified cutting wheel process that requires cutting only the row connecting bridge pieces connected to each end of the PCB, instead of cutting tie bars connected to the side edge of the PCB, which can result in slivers or other imperfections that prevent proper insertion of the card into a host slot. A final grinding step is used to generate a chamfer at the front edge of the molded MicroSD device. Accordingly, the method of the present invention avoids the heat induced damage problems generated by conventional laser cutter singulation methods, avoids the need for recycling the micro size abrasive powder that is required in high pressure water jet singulation methods, and must be more accurate and consistence than mechanical grinding methods. The MicroSD manufacturing method of the present invention is also cleaner and generates less contamination to the working environment than the conventional methods, provides a better edge finish than all three conventional methods, and is lower in cost and higher in manufacturing throughput.

According to an aspect of the invention, passive components are mounted onto the PCB using one or more standard surface mount technology (SMT) techniques, and one or more integrated circuit (IC) die (e.g., a MicroSD controller IC die and a flash memory die) are mounted using chip-on-board (COB) techniques. During the SMT process, the SMT-packaged passive components (e.g., capacitors and oscillators) are mounted onto contact pads disposed on the PCB, and then known solder reflow techniques are utilized to connect leads of the passive components to the contact pads. During the subsequent COB process, the IC dies are secured onto the PCB using know die-bonding techniques, and then electrically connected to corresponding contact pads using, e.g., known wire bonding techniques. After the COB process is completed, the housing is formed over the passive components and IC dies using plastic molding techniques. By combining SMT and COB manufacturing techniques to produce MicroSD devices, the present invention provides an advantage over conventional manufacturing methods that utilize SMT techniques only in that overall manufacturing costs are reduced by utilizing unpackaged controllers and flash devices (i.e., by eliminating the cost associated with SMT-package normally provided on the controllers and flash devices). Moreover, the molded housing provides greater moisture and water resistance and higher impact force resistance than that achieved using conventional manufacturing methods. Therefore, the combined COB and SMT method according to the present invention provides a less expensive and higher quality (i.e., more reliable) memory product than that possible using conventional SMT-only manufacturing methods.

The present invention is also directed to a MicroSD device generated in accordance with the novel method that includes a PCB having components mounted thereon using the combined COB and SMT method, and a molded plastic case that cover the side edges of the PCBA and is exposed only on the bottom surface and end edges thereof, with one edge having a chamfered surface.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
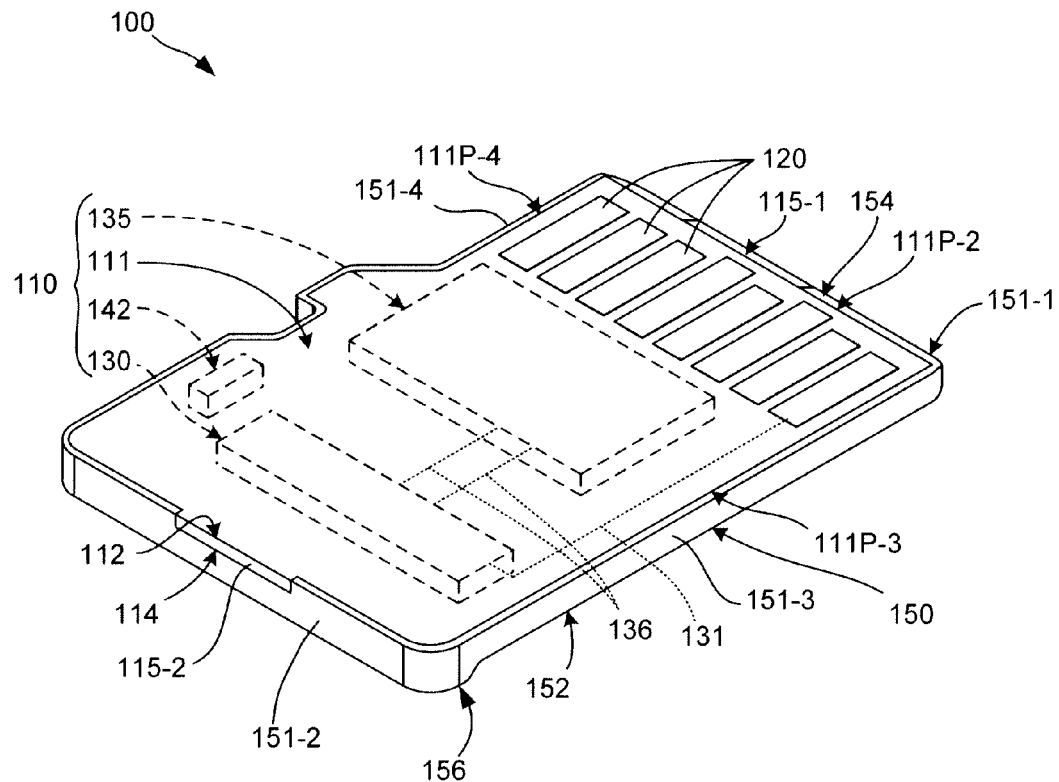
FIG. 1 is a perspective top view showing an exemplary MicroSD device according to an embodiment of the present invention.

The present invention relates to an improvement in manufacturing methods for MicroSD devices, and to the improved MicroSD devices made by these methods. MicroSD is a format for removable flash memory cards that is used mainly in mobile telephones, handheld GPS devices, portable audio players, video game consoles and expandable USB flash memory drives. It is currently (2007) the smallest memory card available commercially, and is about a quarter the size of an SD card, and is currently available with memory capacities ranging from 64 MB to 6 GB (with 8 GB devices announced). Present MicroSD manufacturing methods chip-on-board (COB) processes on a solid printed circuit board (PCB) panel on which a 5×3 array of MicroSD PCBs are printed. Conventional MicroSD production methods are similar to MMC production methods in that they include, after mounting the controller and flash memory devices onto the PCBs to form printed circuit board assemblies (PCBAs), forming (e.g., by plastic molding) a housing over the PCBA, "singulating" the PCB panel by cutting along the entire peripheral edge of each PCBA using either a laser cutting method, a water jet knife cutting method, or a mechanical grinding method to singulate individual MicroSD from the molded PCB panel. Because the entire peripheral edge of each PCBA must be cut to separate the MicroSD devices from the PCBA panel, the conventional MicroSD production methods have a problem similar to that described above with reference to MMC production methods in that they produce a rough finish on the side edges of each finished MicroSD device. In addition, each of the cutting methods used in the conventional MicroSD introduces additional disadvantages. A problem with the laser cutting method is that residual heat from the laser beam heats up the electrical components mounted on the PCBA, and there is a significant percentage of components damaged due to excessive heat during the singulation process. Another disadvantage of laser cutting is that the laser cutter's laser diode has a limited lifetime, and the cost of replacing the laser cutter's laser diode whenever the cutting "mileage" has been reached is significant. The high pressure water jet knife cutting method involves directing a thin water jet at high speed and pressure onto the peripheral edges of the MicroSD PCBA, which results in abrasion that separates the PCBA from the PCBA panel supporting frame. Abrasive powder is added to the water to greatly increase the ability of the water to cut through harder materials. The high pressure water jet knife cutting method is less damaging than the laser cutting method, but involves messy recycling and replacement of abrasive powder which mixed in the water jet to increase the efficiency of the cutting process. This method also generates a relatively large amount of pollutants in the form of abraded particles. Mechanical grinding method involves high speed rotation abrasive wheel to route the outline of the MicroSD card. Tiny particles from the molded MicroSD substrate are generated during grinding. A problem with mechanical grinding methods is that this method is less precise and accurate than laser and high pressure water cutting methods in that the wear and tear of the abrasive is less predictable from one grind wheel to the next, and generates a large amount of particle pollutants.

The following description is presented to enable one of ordinary skill in the art to make and use the invention as provided in the context of a particular application and its requirements. As used herein, the terms "upper", "upwards", "lower", and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 2:
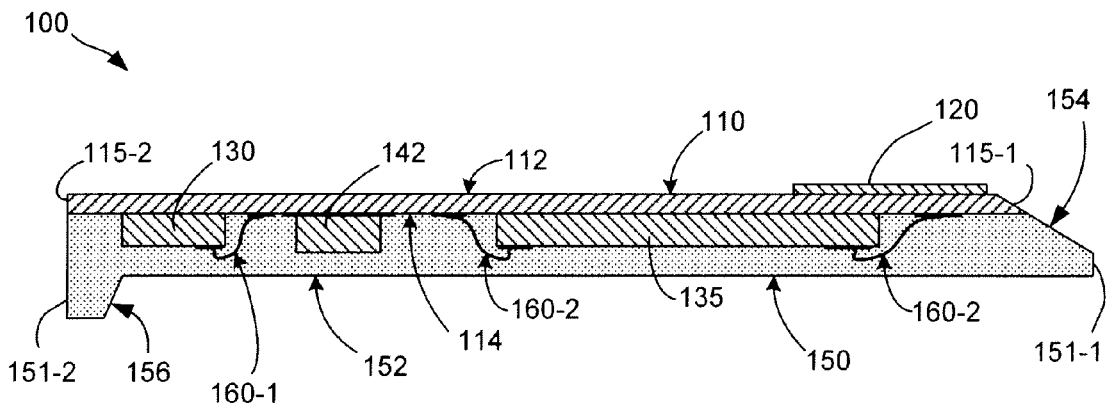
FIG. 2 is a cross sectional side view showing the exemplary MicroSD of FIG. 1.

FIGS. 1 and 2 are perspective and cross-sectional side views showing a MicroSD device 100 according to a first embodiment of the present invention. MicroSD device 100 generally includes a printed circuit board assembly (PCBA) 110 and a plastic housing 150 that is molded onto PCBA 110.

Referring to the upper portion of FIG. 1, PCBA 110 includes a printed circuit board (PCB) 111, and IC dies 130 and 135 and one or more passive components 142 that are mounted on PCB 111. PCB 111 is a substantially flat substrate, and has opposing sides that are referred to below as upper (first) surface 112 and lower (second) surface 114. Formed on upper surface 112 are eight standardized (plug) metal contacts 120 that are shaped and arranged in a pattern established by the MicroSD specification. IC dies 130 and 135 and passive components 142 are mounted on lower surface 114. PCB 111 is formed in accordance with known PCB manufacturing techniques such that metal contacts 120, IC dies 130 and 135, and passive components 142 are electrically interconnected by a predefined network including conductive traces 131 and 136 and other conducting structures that are sandwiched between multiple layers of an insulating material (e.g., FR4 or BT) and adhesive.

According to an aspect of the invention, passive components are mounted onto lower surface 114 using one or more standard surface mount technology (SMT) techniques, and one or more integrated circuit (IC) die (e.g., control IC die 130 and flash memory die 135) are mounted using chip-on-board (COB) techniques. As indicated in FIG. 2, during the SMT process, the passive components, such as capacitor 142, are mounted onto contact pads (described below) disposed on lower surface 114, and are then secured to the contact pads using known solder reflow techniques. To facilitate the SMT process, each of the passive components is packaged in any of the multiple known (preferably lead-free) SMT packages (e.g., ball grid array (BGA) or thin small outline package (TSOP)). In contrast, IC dies 130 and 135 are unpackaged, semiconductor "chips" that are mounted onto surface 114 and electrically connected to corresponding contact pads using known COB techniques. For example, as indicated in FIG. 2, control IC die 130 is electrically connected to PCB 111 by way of wire bonds 160-1 that are formed using known techniques. Similarly, flash memory IC die 135 is electrically connected to PCB 111 by way of wire bonds 160-2. Passive components 142, IC dies 130 and 135 and metal contacts 120 are operably interconnected by way of metal traces 131 and 136 that are formed on and in PCB 111 using known techniques, a few of which being depicted in FIG. 1 in a simplified manner by short dashed lines.

Housing 150 comprises molded plastic arranged such that substantially all of the plastic used to form housing 150 is located level with or below (i.e., on one side of) upper surface 112 of PCB 111. Housing 150 includes a peripheral surface extending downward (i.e., perpendicular to PCB 111), and a lower surface 152 that extends parallel to PCB 111. For discussion purposes, the portion of the peripheral surface disposed at the front end of MicroSD device 100 is referred to as front wall section 151-1, the portion of peripheral surface located at the rear end of device 100 is rear wall section 151-2, and the opposing side portions of the peripheral surface are side wall sections 151-3 and 151-4. By covering the peripheral side edge of PCB 111, peripheral wall 151 prevents objects from wedging between PCB 111 and housing 150, thereby preventing undesirable separation of PCBA 110 from housing 150. As shown is FIG. 2, housing 150 includes a chamfer section 154 extending upward from front wall section 151-1, and a raised, step-like "finger-nail catch" structure 156 extending downward from lower surface 152 adjacent to rear wall section 151-2. These features are provided to facilitate reliable insertion and removal of MicroSD device 100 from a host system (e.g., a multi-media mobile phone).

According to an aspect of the present invention, PCB 111 is formed such that at least one of a rear bridge stub 115-1 and front bridge stub 115-2 extends through front wall section 151-1 and/or rear wall section 151-2, respectively. As described below, bridge stubs 115-1 and 115-2 are part of bridge structures that are used during the fabrication process of the present invention, and are retained after a singulation process during which MicroSD device 100 is separated from a PCB panel.

Figure 3:
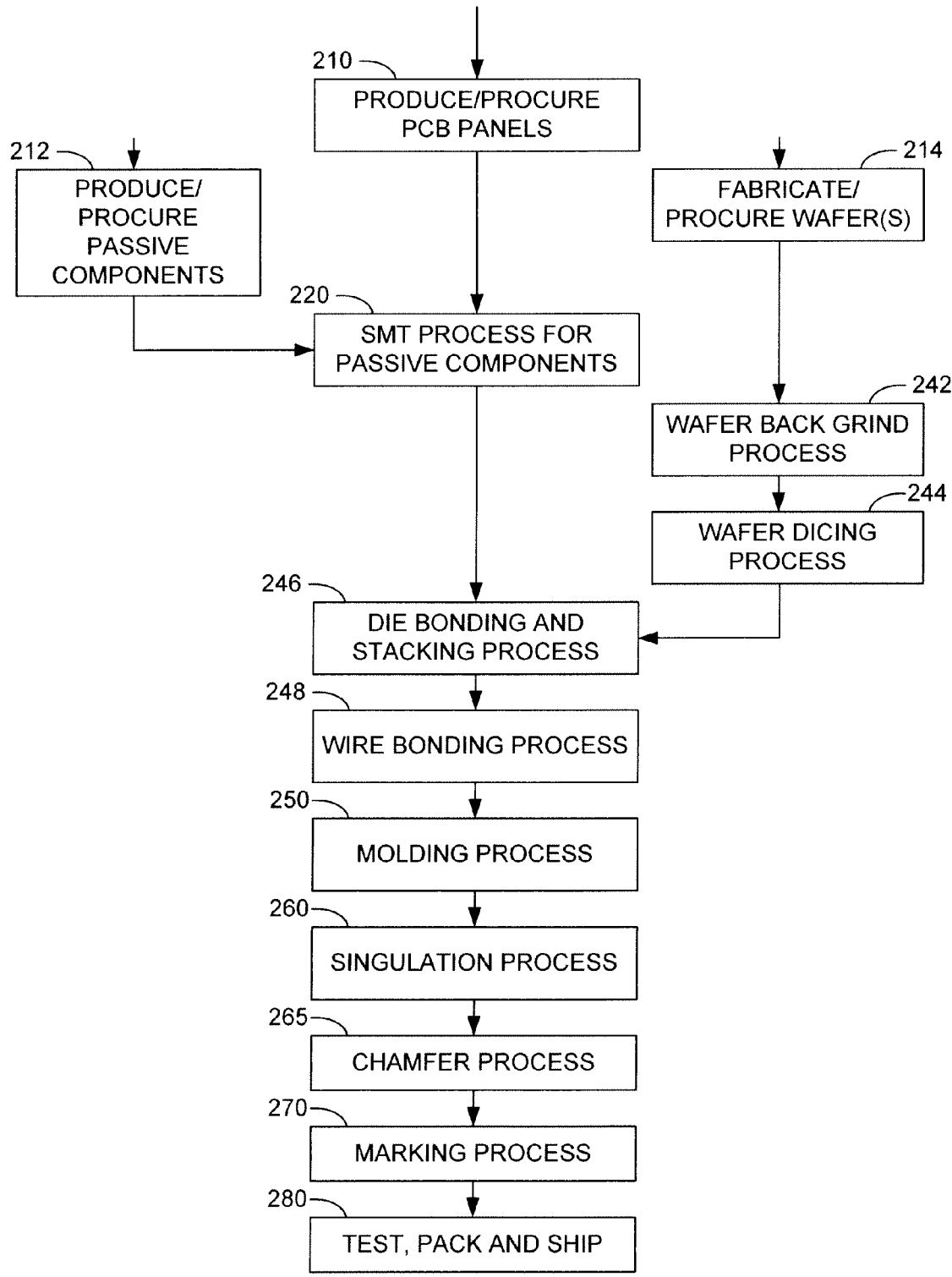
FIG. 3 is a flow diagram showing a method for producing the MicroSD device of FIG. 1 according to another embodiment of the present invention.

FIG. 3 is a flow diagram showing a method for producing MicroSD device 100 according to another embodiment of the present invention. Summarizing the novel method, a PCB panel is generated using known techniques (block 210), passive components are produced/procured (block 212), and integrated circuit (IC) wafers are fabricated or procured block 214). The passive components are mounted on the PCB panel using SMT techniques (block 220), and the IC dies are subject to a grind-back process (block 242) and dicing process (block 244) before being die bonded (block 246) and wire bonded (block 248) onto the PCB panel using known COB techniques. Molten plastic is then used to form a molded housing over the passive components and the IC dies (block 250). Then PCB panel is then singulated (cut) in to separate MicroSD devices (block 260), and the individual MicroSD devices are subjected to a chamfer process (block 265). The MicroSD devices are then marked (block 270), and then the MicroSD devices are tested, packed and shipped (block 280) according to customary practices. This method provides several advantages over conventional manufacturing methods that utilize SMT techniques only. First, by utilizing COB techniques to mount the MicroSD controller and flash memory, the large amount of space typically taken up by these devices is dramatically reduced, thereby facilitating significant miniaturization of the resulting MicroSD device footprint. Second, by implementing the wafer grinding methods described below, the die height is greatly reduced, thereby facilitating a stacked memory arrangement that a significant memory capacity increase over packaged flash memory arrangements. The molded housing also provides greater moisture and water resistance and higher impact force resistance than that achieved using conventional manufacturing methods. In comparison to the standard MicroSD memory card manufacturing that used SMT process, it is cheaper to use the combined COB and SMT (plus molding) processes described herein because, in the SMT-only manufacturing process, the bill of materials such as Flash memory and the controller chip are also manufactured by COB process, so all the COB costs are already factored into the packaged memory chip and controller chip. Therefore, the combined COB and SMT method according to the present invention provides a less expensive and higher quality (i.e., more reliable) memory product with a smaller size than that possible using conventional SMT-only manufacturing methods.

The flow diagram of FIG. 3 will now be described in additional detail below with reference to FIGS. 4(A) to 20.

Referring to the upper portion of FIG. 3, the manufacturing method begins with filling a bill of materials including producing/procuring PCB panels (block 210), producing/procuring passive (discrete) components (block 212) such as resistors, capacitors, diodes, and oscillators that are packaged for SMT processing, and producing/procuring a supply of IC wafers (or individual IC dies, block 214).

Figure 4A:
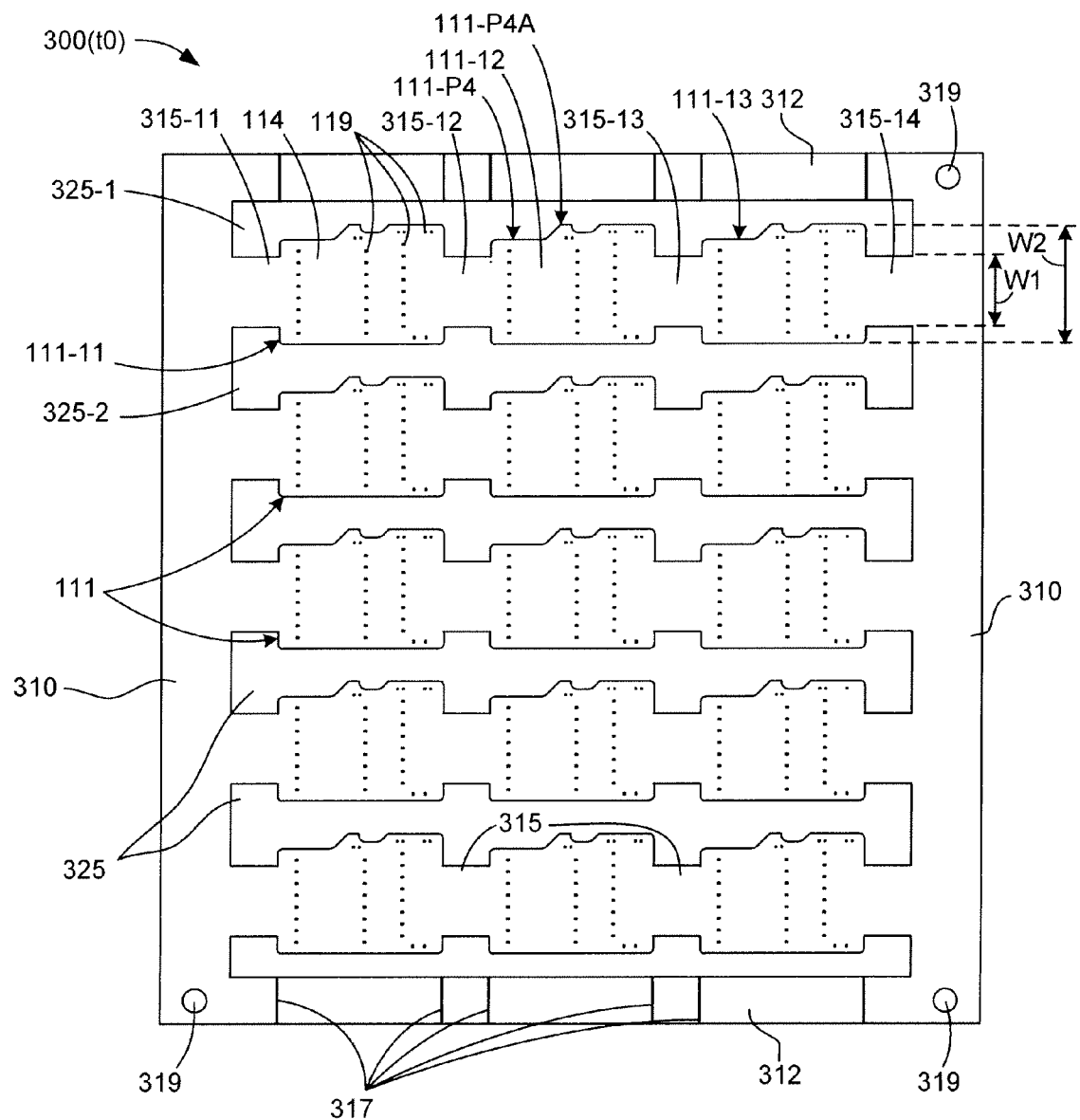
FIGS. 4(A) and 4(B) are bottom and top views showing a PCB panel utilized in the method of FIG. 3.
Figure 4B:
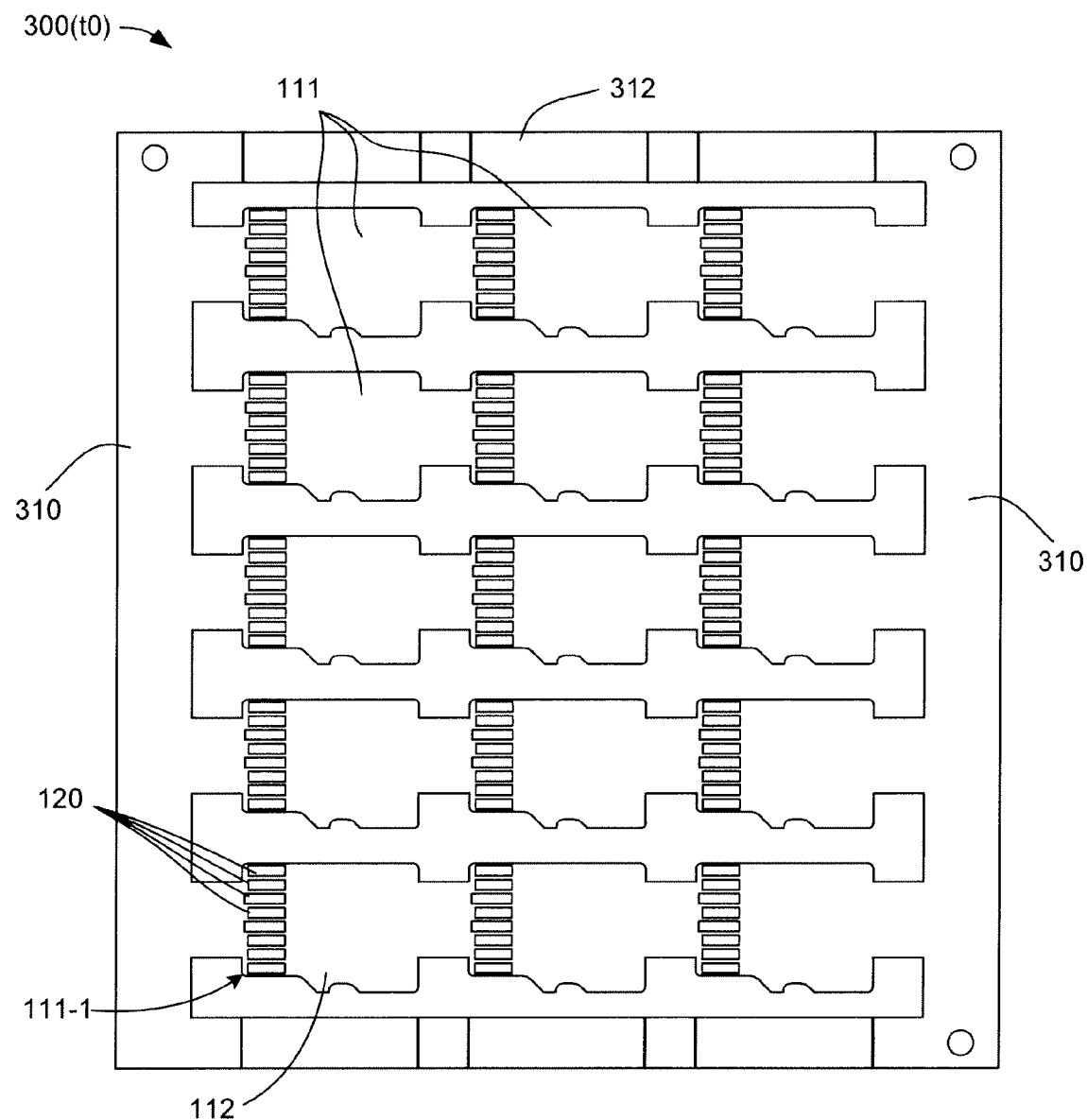

FIGS. 4(A) and 4(B) are simplified top and bottom views, respectively, showing a PCB panel 300(t0) provided in block 210 of FIG. 3 according to a specific embodiment of the present invention. The suffix "tx" is utilized herein to designated the state of the PCB panel during the manufacturing process, with "t0" designating an initial state. Sequentially higher numbered prefixes (e.g., "t1", "t2" and "t3") indicate that PCB panel 300 has undergone additional sequential production processes.

As indicated in FIGS. 4(A) and 4(B), PCB panel 300(t0) includes a five-by-three matrix of PCBs 111 that is supported by opposing end border structures 310 and side border structures 312, which are integrally connected to form a square or rectangular frame of blank material around PCBs 111. Each PCB 111 having the features described above with reference to FIGS. 1 and 2, and the additional features described below. FIG. 4(A) shows lower surface 114 of each PCB 111, and FIG. 4(B) shows upper surface 112 of each PCB 111 including standard metal contacts 120. Note that lower surface 114 of each PCB 111 (e.g., PCB 111-11) includes multiple contact pads 119 arranged in predetermined patterns for facilitating SMT and COB processes, as described below. Referring to FIG. 4(A), each PCB 111 in each row is connected to either an end border structure 310 or to an adjacent PCB 111 by way of connecting bridge structures 315 that extend from the front and rear edges thereof. For example, referring to the upper row of PCBs in FIG. 4(A), PCB 111-11 is connected by connecting bridge structure 315-11 to the left-side end border structure 310, and by connecting bridge structure 315-11 to adjacent PCB 315-12. Note that, in each row, one PCB (e.g., PCB 315-12) is connected to a first adjacent PCB (e.g., PCB 111-11 by a first connecting bridge structure (e.g., structure 315-11) and to a second adjacent PCB (e.g., PCB 111-13) by a second connecting bridge structure (e.g., structure 315-13).

In accordance with an aspect of the present invention, connecting bridge structures 315 have widths that are narrower than the overall widths of PCBs 111 in order to minimize the exposed edge PCB material in the finished MicroSD device. In particular, referring to the right side of FIG. 4(A), each connecting bridge structures 315 (e.g., connecting bridge structure 315-14) has a width W1 that is substantially narrower than the overall width W2 defined by the opposing side edges of PCB 111-13. As described in additional detail below, this feature facilitates the formation of molded plastic over at least a portion of the end edges of PCBs 111, which produces a smoother and more appealing package.

In accordance with another aspect of the present invention, PCB panel 300 defines elongated stamped blank slots 325 that are disposed along the sides of each row of PCBs 111. For example, elongated stamped blank slots 325-1 and 325-2 are disposed on opposing sides of the row containing PCBs 111-11, 111-12 and 111-13, thereby exposing the side edges (and portions of the front and rear edges) of each PCB 111-11, 111-12 and 111-13. In addition, each side edge 111-P4 (e.g., see PCB 111-12) includes a hook shape 111-P4A that corresponds to the finished MicroSD structure. As descried in additional detail below, this feature facilitates formation of the plastic molded housing such that the plastic material extends over the peripheral edge of each PCB 111 to both strengthen and provide a more appealing finish to MicroSD 100.

In accordance with another aspect of the present invention, designated cut lines 317 are scored or otherwise partially cut into side border structure 312 of PCB panel 300 that are aligned with the front and rear edges of PCBs 111 aligned in each column. Cut lines may also formed along the front and rear edges of each PCB 111 that are aligned with cut lines 317. In an alternative embodiment, cut lines 317 may be omitted, or comprise surface markings that do not weaken the panel material.

In accordance with yet another aspect of the present invention, border structures 310 and 312 are provided with positioning holes 319 to facilitate alignment between PCB panel 300 and the plastic molding die during molded housing formation, as described below.

Figure 5:
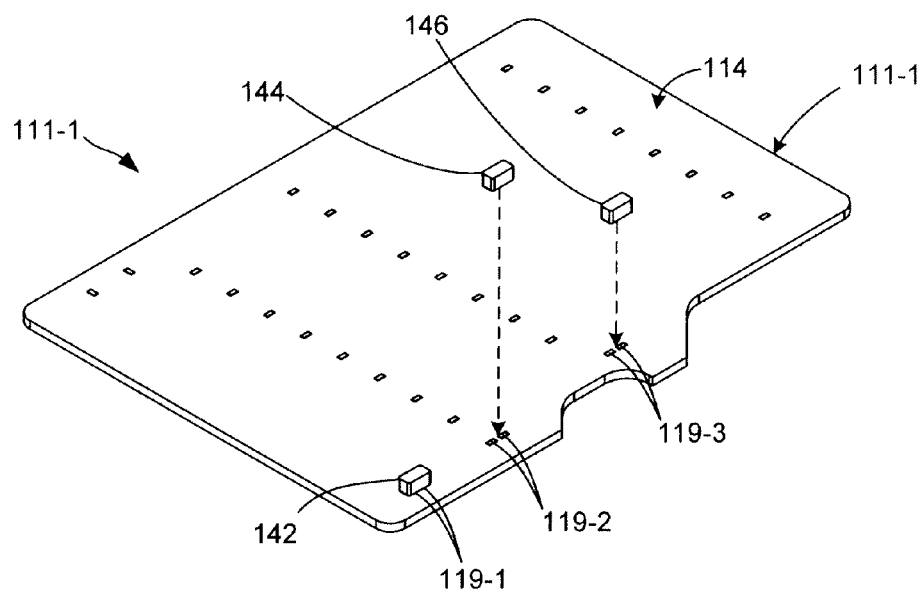
FIG. 5 is a perspective view depicting a surface mount technology (SMT) process for mounting passive components on a PCB according to the method of FIG. 3.
Figure 6:
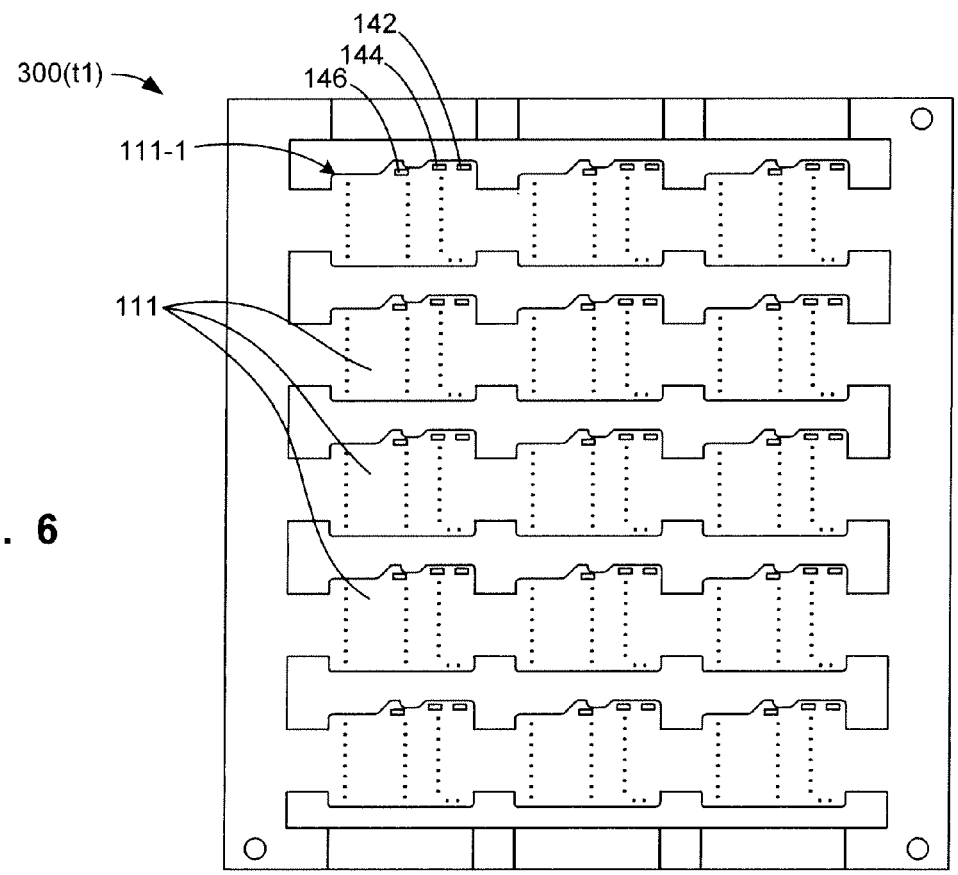
FIG. 6 is a top view showing the PCB panel of FIG. 4(B) after the SMT process is completed.

FIG. 5 is a perspective view depicting a PCB 111-1 of panel 300(t0) during a SMT process that is used to mount passive components on PCB 111-1 according to block 220 of FIG. 3. During the first stage of the SMT process, lead-free solder paste (not shown) is printed on contact pads 119-1, 119-2 and 119-3, which in the present example corresponds to SMT components 142, 144 and 146, using custom made stencil that is tailored to the design and layout of PCB 111-1. After dispensing the solder paste, the panel is conveyed to a conventional pick-and-place machine that mounts SMT components 142, 144 and 146 onto contact pads 119-1, 119-2 and 119-3, respectively, according to known techniques. Upon completion of the pick-and-place component mounting process, the PCB panel is then passed through an IR-reflow oven set at the correct temperature profile. The solder of each pad on the PC board is fully melted during the peak temperature zone of the oven, and this melted solder connects all pins of the passive components to the finger pads of the PC board. FIG. 6 shows the resulting sub-assembled PCB panel 300(t1), in which each PCB 111 (e.g., PCB 111-1) includes passive components 142, 144 and 146 mounted thereon by the completed SMT process.

Figure 7:
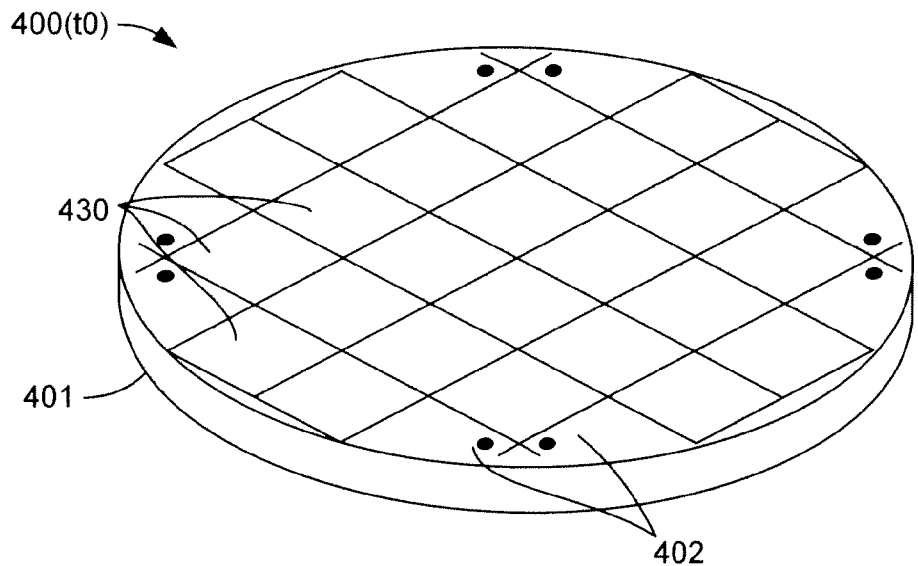
FIG. 7 is a simplified perspective view showing a semiconductor wafer including integrated circuits (ICs) utilized in the method of FIG. 3.

FIG. 7 is a simplified perspective view showing a semiconductor wafer 400(t0) procured or fabricated according to block 214 of FIG. 3. Wafer 400(t0) includes multiple ICs 430 that are formed in accordance with known photolithographic fabrication (e.g., CMOS) techniques on a semiconductor base 401. The corner partial dies 402 are inked out during die probe wafer testing, as are complete dies that fail electrical function or DC/AC parametric tests. In the example described below, wafer 400(t1) includes ICs 430 that comprise MicroSD controller circuits. In a related procedure, a wafer (not shown) similar to wafer 400(t1) is produced/procured that includes flash memory circuits, and in an alternative embodiment, ICs 430 may include both MicroSD controller circuits and flash memory circuits. In each instance, these wafers are processed as described herein with reference to FIGS. 8(A), 8(B) and 8(C).

Figure 8A:
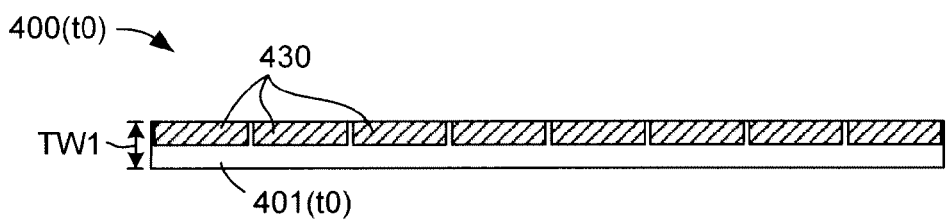
FIGS. 8(A), 8(B) and 8(C) are simplified cross-sectional side views depicting a process of grinding and dicing the wafer of FIG. 7 to produce IC dies.
Figure 8B:
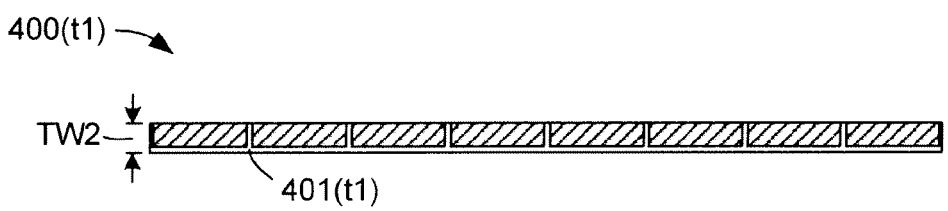

As indicated in FIGS. 8(A) and 8(B), during a wafer back grind process according to block 242 of FIG. 3, base 401 is subjected to a grinding process in order to reduce the overall initial thickness TW1 of each IC 430. Wafer 400(t1) is first mount face down on sticky tape (i.e., such that base layer 401(t0) faces away from the tape), which is pre-taped on a metal or plastic ring frame (not shown). The ring-frame/wafer assembly is then loaded onto a vacuum chuck (not shown) having a very level, flat surface, and has diameter larger than that of wafer 400(t0). The base layer is then subjected to grinding until, as indicated in FIG. 8(B), wafer 400(t1) has a pre-programmed thickness TW2 that is less than initial thickness TW1 (shown in FIG. 8(A)). The wafer is cleaned using de-ionized (DI) water during the process, and wafer 400(t1) is subjected to a flush clean with more DI water at the end of mechanical grinding process, followed by spinning at high speed to air dry wafer 400(t1).

Figure 8C:
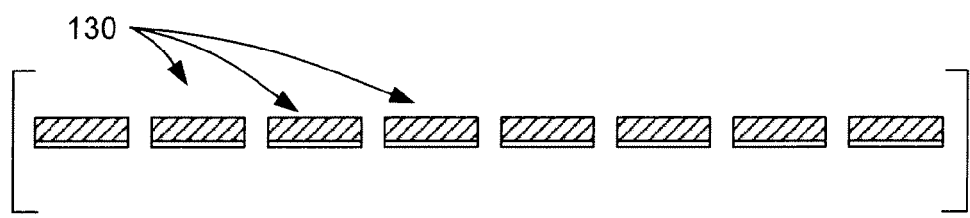

Next, as shown in FIG. 8(C), the wafer is diced (cut apart) along predefined border structures separating ICs 420 in order to produce IC dies 130 according to block 244 of FIG. 3. After the back grind process has completed, the sticky tape at the front side of wafer 400(t1) is removed, and wafer 400(t1) is mounted onto another ring frame having sticky tape provided thereon, this time with the backside of the newly grinded wafer contacting the tape. The ring framed wafers are then loaded into a die saw machine. The die saw machine is pre-programmed with the correct die size information, X-axis and Y-axis scribe lanes' width, wafer thickness and intended over cut depth. A proper saw blade width is then selected based on the widths of the XY scribe lanes. The cutting process begins dicing the first lane of the X-axis of the wafer. De-ionized wafer is flushing at the proper angle and pressure around the blade and wafer contact point to wash and sweep away the silicon saw dust while the saw is spinning and moving along the scribe lane. The sawing process will index to the second lane according to the die size and scribe width distance. After all the X-axis lanes have been completed sawing, the wafer chuck with rotate 90 degree to align the Y-axis scribe lanes to be cut. The cutting motion repeated until all the scribe lanes on the Y-axis have been completed.

Figure 9:
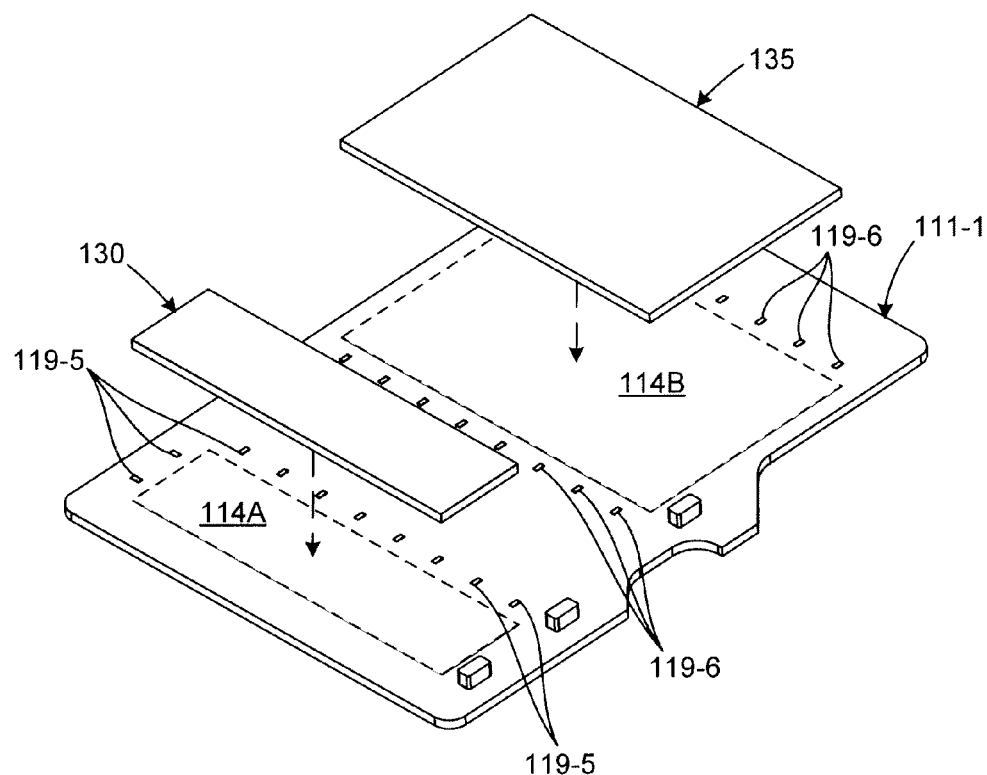
FIG. 9 is a perspective view depicting a die bonding process utilized to mount the IC dies of FIG. 8(C) on a PCB according to the method of FIG. 3.
Figure 10:
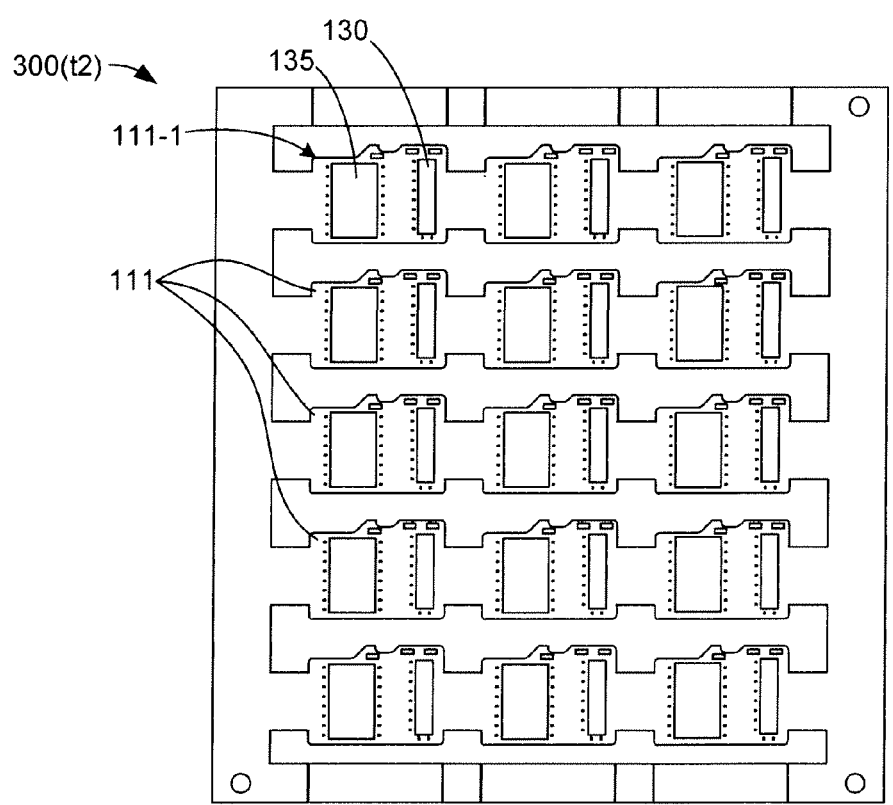
FIG. 10 is a top view showing the PCB panel of FIG. 4(B) after the die bonding process is completed.

FIG. 9 is a perspective view depicting a die bonding process utilized to mount the controller IC dies 130 of FIG. 8(C) and flash memory IC dies 135 on PCB 111-1 of the PCB panel according to block 246 of FIG. 3. The die bonding process is performed on PCB panel 300(t1) (see FIG. 6), that is, after completion of the SMT process. The die bonding process generally involves mounting controller IC dies 130 into lower surface region 114A, which is bordered by contact pads 119-5, and mounting flash IC dies 135 into lower surface region 114B, which is disposed between rows of contact pads 119-6. In one specific embodiment, an operator loads IC dies 130 and 135 onto a die bonder machine according to known techniques. The operator also loads multiple PCB panels 300(t1) onto the magazine rack of the die bonder machine. The die bonder machine picks the first PCB panel 300(t1) from the bottom stack of the magazine and transports the selected PCB panel from the conveyor track to the die bond (DB) epoxy dispensing target area. The magazine lowers a notch automatically to get ready for the machine to pick up the second piece (the new bottom piece) in the next cycle of die bond operation. At the die bond epoxy dispensing target area, the machine automatically dispenses DB epoxy, using pre-programmed write pattern and speed with the correct nozzle size, onto the target areas 114A and 114B of each of the PCB 111 of PCB panel 300(t1). When all PCBs 111 have completed this epoxy dispensing process, the PCB panel is conveyed to a die bond (DB) target area. Meanwhile, at the input stage, the magazine is loading a second PCB panel to this vacant DB epoxy dispensing target area. At the die bond target area, the pick up arm mechanism and collet (suction head with rectangular ring at the perimeter so that vacuum from the center can create a suction force) picks up an IC die 130 and bonds it onto area 114A, where epoxy has already dispensed for the bonding purpose, and this process is then performed to place IC die 135 into region 114B. Once all the PCB boards 111 on the PCB panel have completed die bonding process, the PCB panel is then conveyed to a snap cure region, where the PCB panel passes through a chamber having a heating element that radiates heat having a temperature that is suitable to thermally cure the epoxy. After curing, the PCB panel is conveyed into the empty slot of the magazine waiting at the output rack of the die bonding machine. The magazine moves up one slot after receiving a new panel to get ready for accepting the next panel in the second cycle of process. The die bonding machine will repeat these steps until all of the PCB panels in the input magazine are processed. This process step may repeat again for the same panel for stack die products that may require to stacks more than one layer of memory die. FIG. 10 is a top view showing PCB panel 300(t2) after the die bonding process is completed and controller IC 130 and memory IC 135 are mounted onto each PCB (e.g., PCB 111-1).

Figure 11:
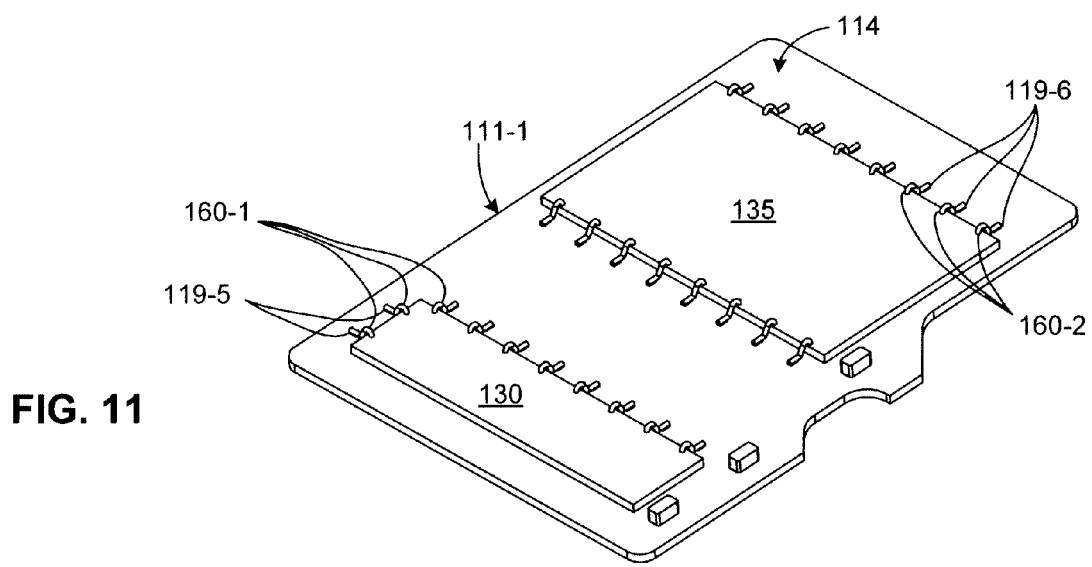
FIG. 11 is a perspective view depicting a PCB of the PCB panel of FIG. 10 after a wire bonding process is performed to connect the IC dies of FIG. 8(C) to corresponding contact pads disposed on a PCB according to the method of FIG. 3.
Figure 12:
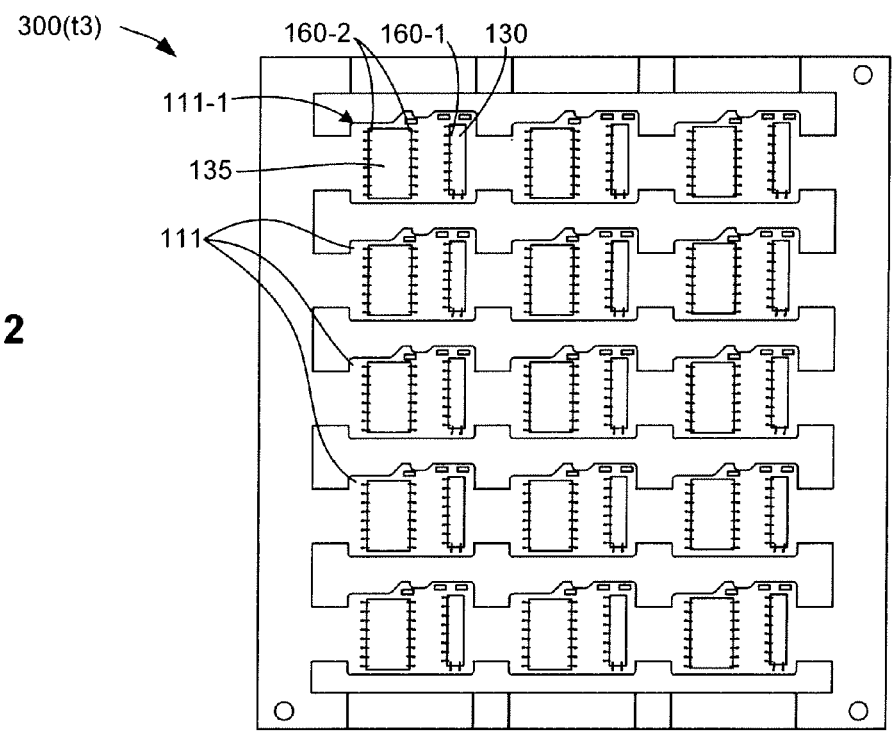
FIG. 12 is a top view showing the PCB panel of FIG. 4(B) after the wire bonding process is completed.

FIG. 11 is a perspective view depicting a wire bonding process utilized to connect the IC dies 130 and 135 to corresponding contact pads 119-5 and 119-6 of PCB 111-1, respectively, according to block 248 of FIG. 3. The wire bonding process proceeds as follows. Once a full magazine of PCB panels 300(t2) (see FIG. 10) has completed the die bonding operation, an operator transports the PCB panels 300(t2) to a nearby wire bonder (WB) machine, and loads the PCB panels 300(t2) onto the magazine input rack of the WB machine. The WB machine is pre-prepared with the correct program to process this specific MicroSD device. The coordinates of all the ICs' pads 119-5 and 119-6 and PCB gold fingers were previously determined and programmed on the WB machine. After the PCB panel with the attached dies 130 and 135 is loaded at the WB bonding area, the operator commands the WB machine to use optical vision to recognize the location of the first wire bond pad 131 of the first controller die 130 of PCB 111-1 on the panel. A corresponding wire 160-1 is then formed between wire bond pad 131 and a corresponding contact pad 119-5 formed on PCB 111-1. Once the first pin is set correctly and the first wire bond 160-1 is formed, the WB machine can carry out the whole wire bonding process for the rest of controller die 130, and then proceed to forming wire bonds 160-2 between corresponding wire bond pads 136 and contact pads 119-6 to complete the wire bonding of memory die 135. Upon completing the wiring bonding process for PCB 111-1, the wire bonding process is repeated for each PCB 111 of the panel. For multiple flash layer stack dies, the PCB panels may be returned to the WB machine to repeat wire bonding process for the second stack. FIG. 12 is a top view showing PCB panel 300(t3) after the wire bonding process is completed.

Figure 13:
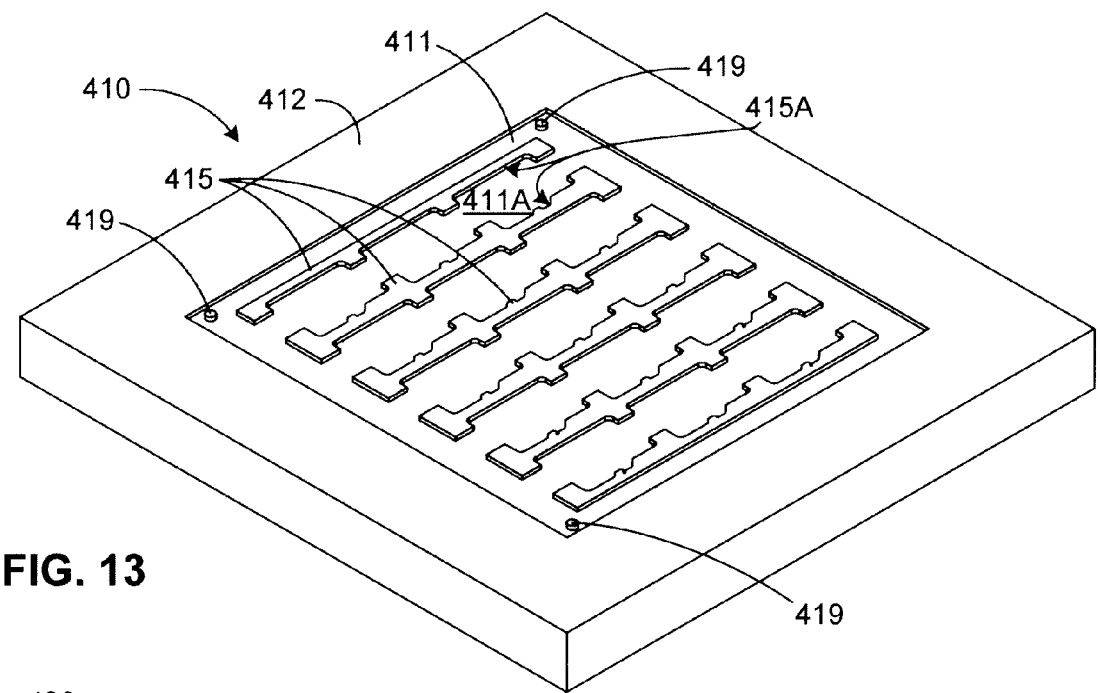
FIG. 13 is a perspective view showing a lower molding die utilized in a molding process for forming a molded housing over the PCB panel of FIG. 4(B) according to the method of FIG. 3.

FIG. 13 is a perspective top view showing a lower die 410 of a simplified top and enlarged partial top views depicting a lower (first) molding die including a shallow cavity 411 surrounded by a peripheral surface 412, and a series of raised, elongated parallel island structures 415 that are disposed in cavity 411. Island structures 415 include side walls 415A that generally define cavity portions 411A, where each cavity portion 411A is shaped to receive a PCB 111 of PCB panel 300(t3) (see FIG. 12) in the manner described below. In addition, lower die 410 includes three raised alignment poles 419 that are positioned to receive alignment holes 319 of PCB panel 300 (see FIG. 4(A)). Alignment poles 419 have a height that is not greater than the thickness of PCB panel 300.

Figure 14:
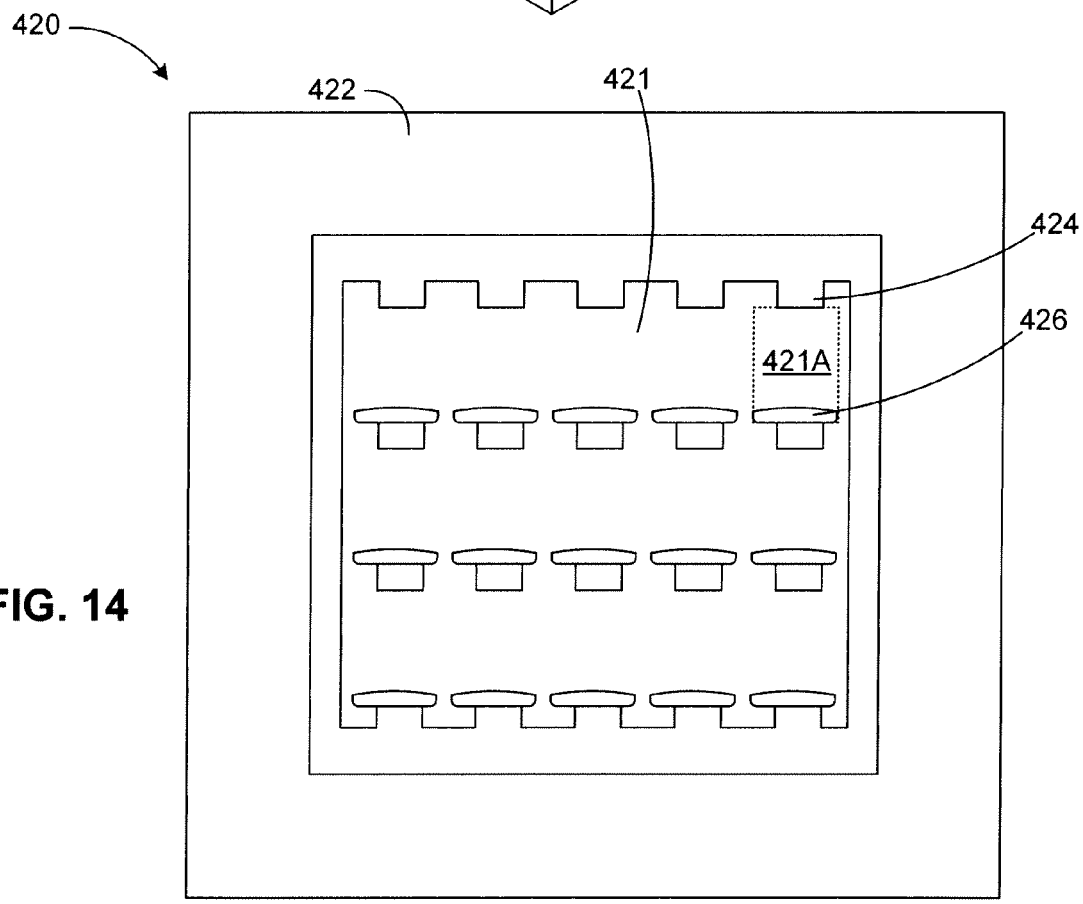
FIG. 14 is a top plan view showing an upper molding die that is used in conjunction with the lower molding die of FIG. 13 in the molding process according to the method of FIG. 3.

FIG. 14 is a top view showing an upper molding die 420 that is used in conjunction with lower molding die 410 (FIG. 13). Upper molding die 420 includes a central region 421 surrounded by a peripheral surface 422 that are mounted over and pressed against cavity 411 and peripheral surface 412 of lower molding die 410 during the molding process. Regions 421A of upper molding die 420 cooperate with corresponding cavity portions 411A (see FIG. 13) to define molding chamber regions into which molten plastic is injected to form molded housing structures. When mounted onto lower molding die 410 (as described below), raised separation bars 424 press against connecting bridge structures 315 of panel 300 (see FIG. 4(A)) to formation of plastic material on connecting bridge structures 315 during the molding process. Recessed regions 426 are provided at one end of each region 421A to facilitate the formation of finger-nail catch 156 (see FIG. 1).

Figure 15A:
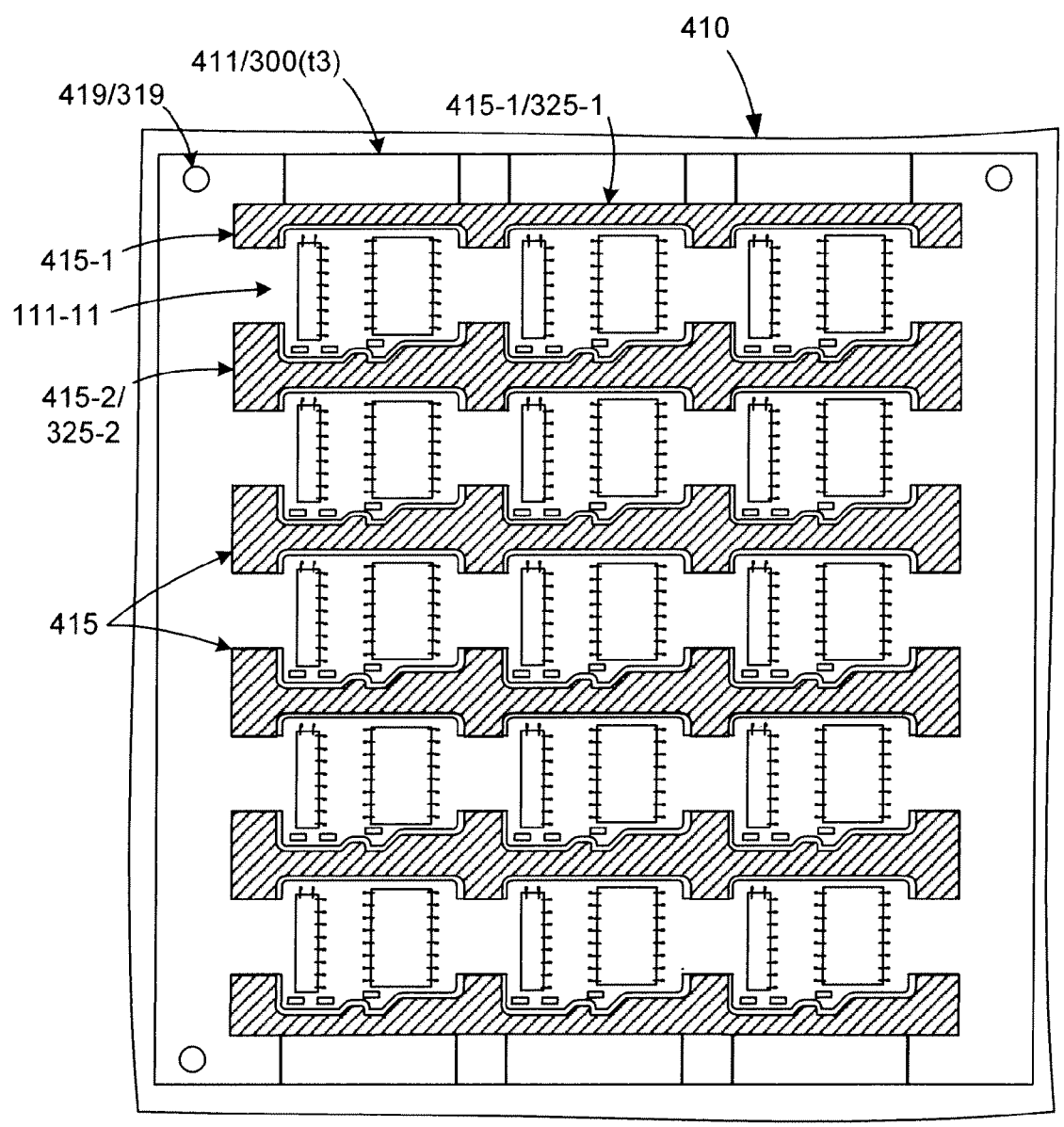
FIGS. 15(A) and 15(B) are top plan and enlarged partial top plan views depicting a first step of mounting the PCB panel of FIG. 12 into the lower molding die of FIG. 13 according to the method of FIG. 3.
Figure 15B:
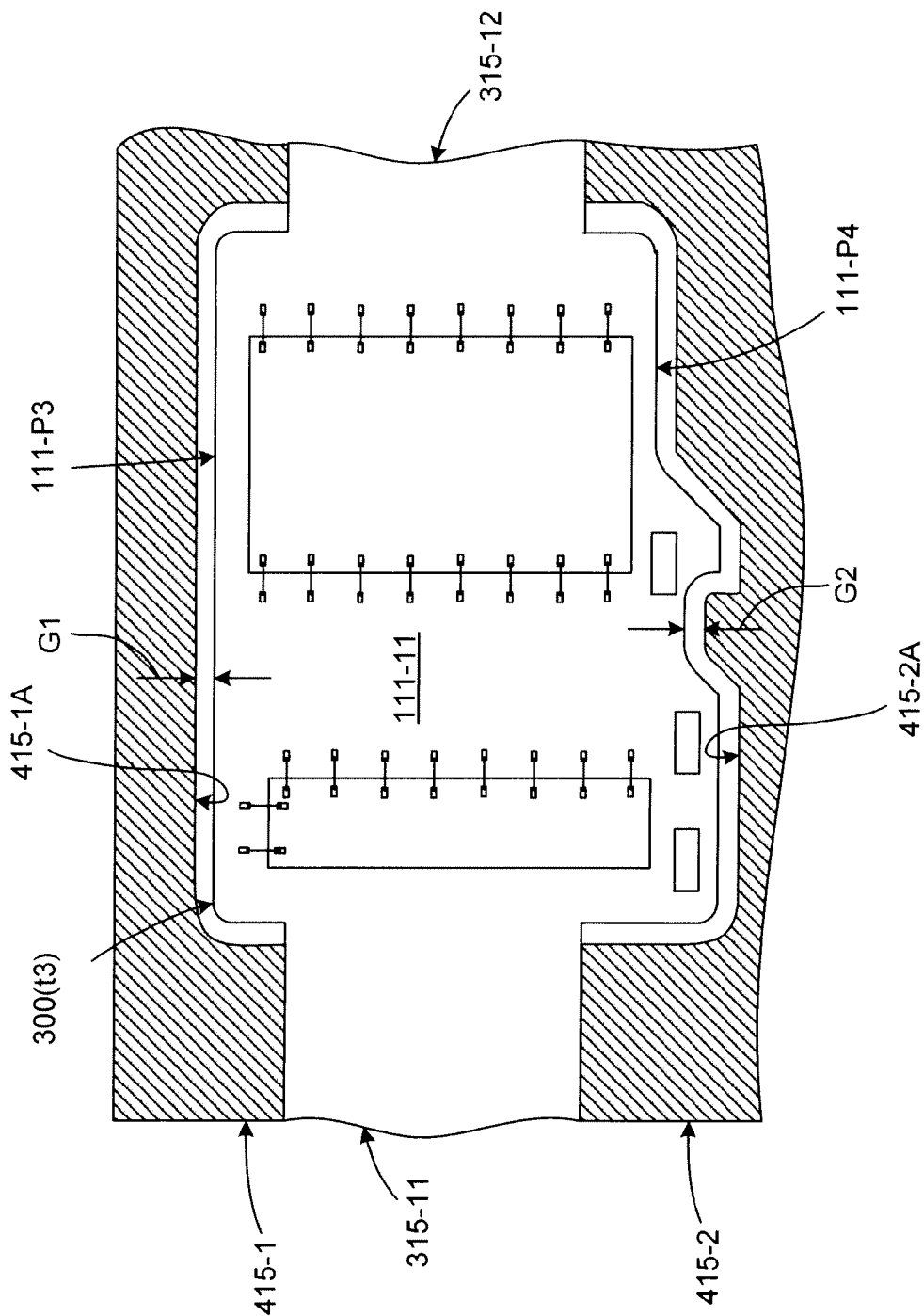

FIGS. 15(A) and 15(B) are top plan and enlarged partial top plan views depicting mounting PCB panel 300(t3) into lower molding die 410 such that each raised island structure 415 is received inside a corresponding stamped blank slot 325. For example, as indicated at the top of FIG. 15(A), island structure 415-1 is inserted through slot 325-1, and island structure 415-2 is inserted through slot 325-2, thereby trapping the row including PCB 111-11 therebetween. In addition, and each alignment pole 419 is received inside a corresponding alignment hole 319, as shown in the top left corner of FIG. 15(A). According to another aspect of the invention, PCB panel 300(t3) is held such that the inside walls 415A of each island structure 415 is spaced from the corresponding side walls of PCBs 111 by a predetermined gap distance. For example, as indicated in detail in FIG. 15(B), PCB 111-11 is positioned between island structures 415-1 and 415-2 such that a gap G1 is defined between side edge 111-P3 and wall 415-1A, and a gap G2 is defined between side edge 111-P4 and wall 415-2A. Note that, unlike the side edges of PCB 111-11, connecting bridge structures 315-11 and 315-12 are snuggly fitted between the corresponding wall portions of island structures 415-1 and 415-2.

Figure 16A:
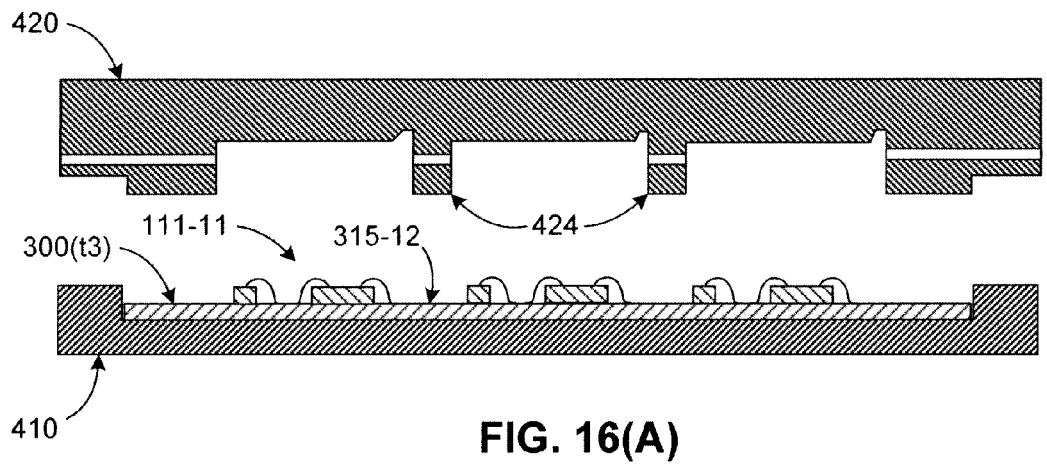
FIGS. 16(A), 16(B) and 16(C) are simplified cross-sectional side views depicting subsequent steps of assembling the molding die and injecting molten plastic according to the method of FIG. 3.
Figure 16B:
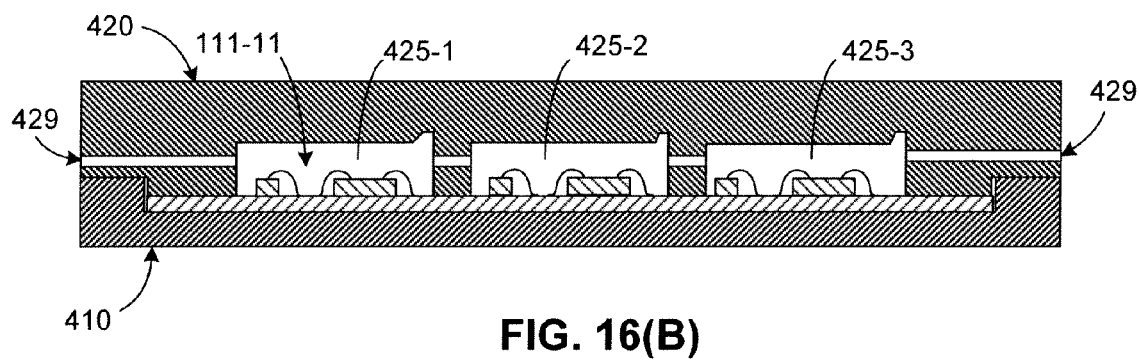
Figure 16C:
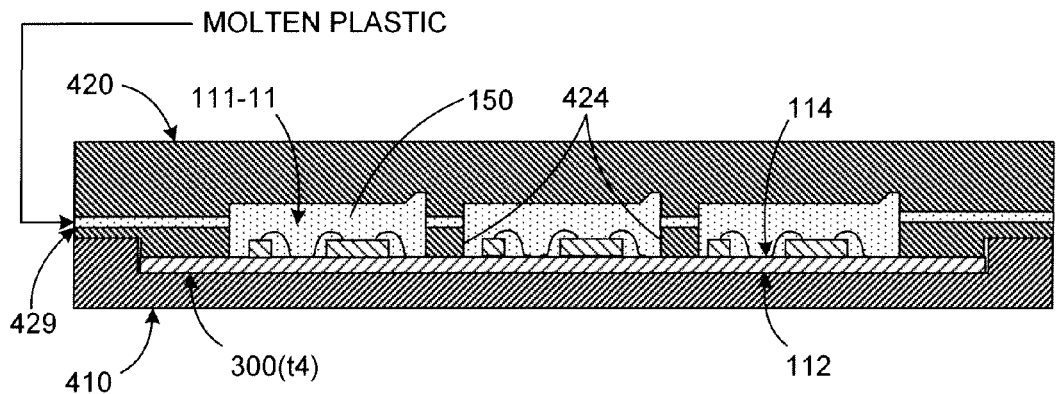

FIGS. 16(A), 16(B) and 16(C) are simplified cross-sectional side views depicting a molding process using molding dies 410 and 420. As indicated in FIGS. 16(A) and 16(B), after panel 300(t3) is loaded into lower molding die 410, upper molding die 420 is positioned over and lowered onto lower molding die 410 until separation bars 424 press against corresponding connecting bridge structures (e.g., bridge structure 315-12 extending from PCB 111-11), thereby forming substantially enclosed chambers over each PCB (e.g., as indicated in FIG. 16(B), chamber 425-1 is formed over PCB 111-11). Referring again to FIG. 16(B), in accordance with another aspect of the invention, a single run gate (channel) set 429 is provided for each row of PCBs that facilitates the injection of molten plastic into each chamber 425-1, 425-2 and 425-3, as indicated in FIG. 16(C), whereby single-piece molded housings 150 are formed over each PCB (e.g., PCB 111-11). From this point forward, the PCB panel is referred to as 300(t4).

FIG. 16(C) depicts the molding process. Transfer molding is prefer here due to the high accuracy of transfer molding tooling and low cycle time. The molding material in the form of pellet is preheated and loaded into a pot or chamber (not shown). A plunger (not shown) is then used to force the material from the pot through channel sets 429 (also known as a spruce and runner system) into the mold cavities 425-1 to 425-3 (see FIG. 16(B)), causing the molten (e.g., plastic) material to form molded housing 150 that encapsulate all the IC chips and components, and to cover all the exposed areas of lower surface 114. Note that, because PCB 300 is pressed against lower mold 420 by separation bars 424, no molding material is able to form on upper surface 112. The mold remains closed as the material is inserted and filled up all vacant areas of the mold die. During the process, the walls of upper die 420 are heated to a temperature above the melting point of the mold material, which facilitates a faster flow of material. The mold assembly remains closed until a curing reaction within the molding material is complete. A cooling down cycle follows the injection process, and the molding materials start to solidify and harden. Ejector pins push PCB panel 300(t4) (shown in FIGS. 16(C) and 17) from the mold machine once the molding material has hardened sufficiently.

Figure 17:
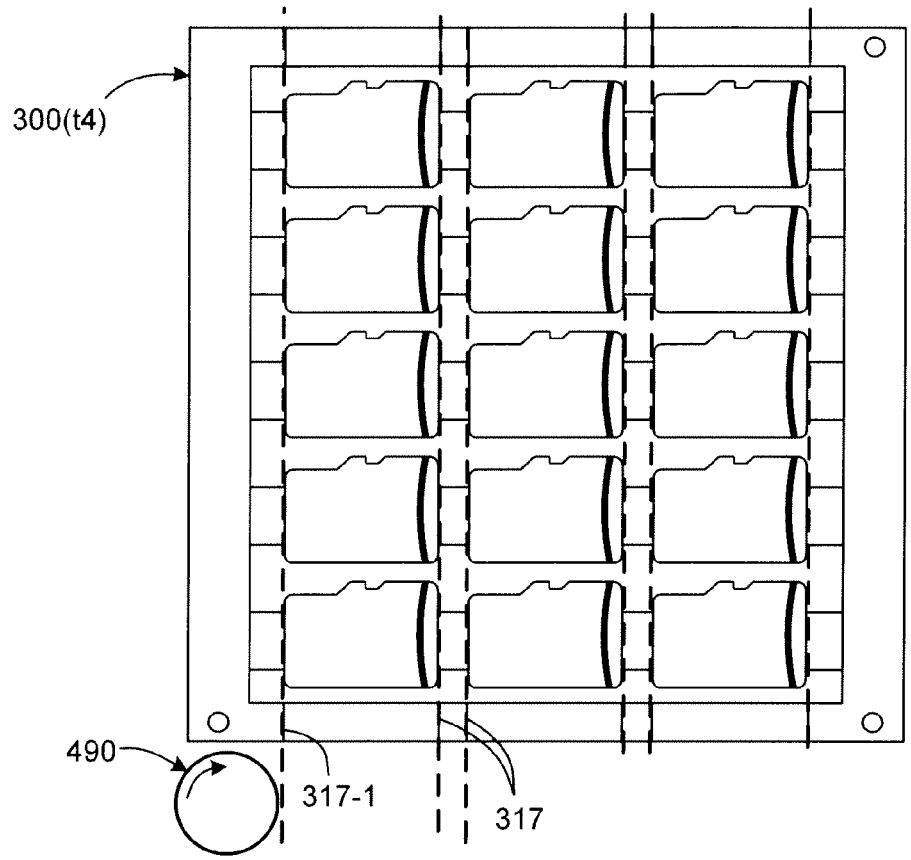
FIG. 17 is simplified top view depicting the PCB panel of FIG. 4(B) during singulation into individual MicroSD devices according to the method of FIG. 3.
Figure 18:
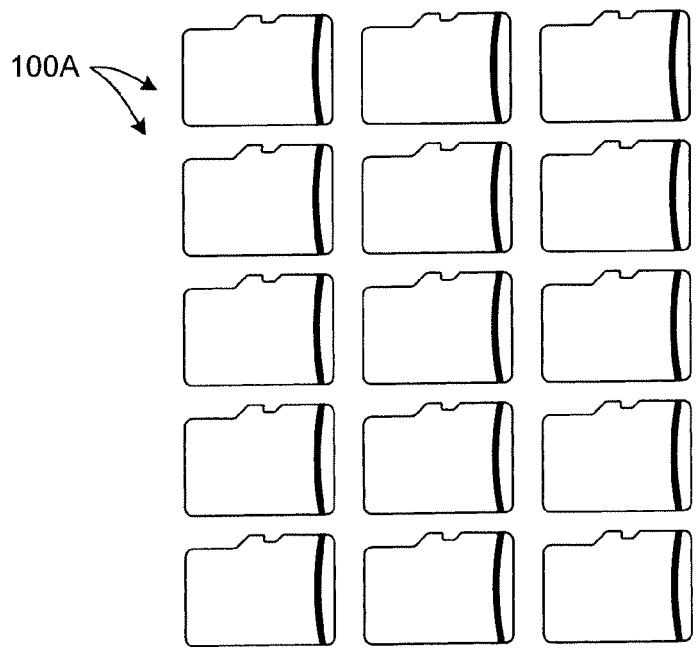
FIG. 18 is simplified top view depicting the individual MicroSD devices after completion of the singulaion process of FIG. 17 is completed.

FIG. 17 is a top plan view depicting a singulation process according to block 260 of FIG. 3 that is used to separate PCB panel 300(t4) into individual MicroSD devices. PCB panel 300(t4) is loaded into a saw machine (not shown) that is pre-programmed with a singulation routine that includes predetermined cut locations defined by designated cut lines 317. A saw blade 490 is aligned to the first cut line (e.g., end cut line 317-1) as a starting point by the operator. The coordinates of the first position are stored in the memory of the saw machine. The saw machine then automatically proceeds to cut up (singulate) the MicroSD panel 300(t4), for example, successively along cut lines 317. FIG. 18 is a top view showing the individual MicroSD devices 100A after the singulation process is completed.

Figure 19A:
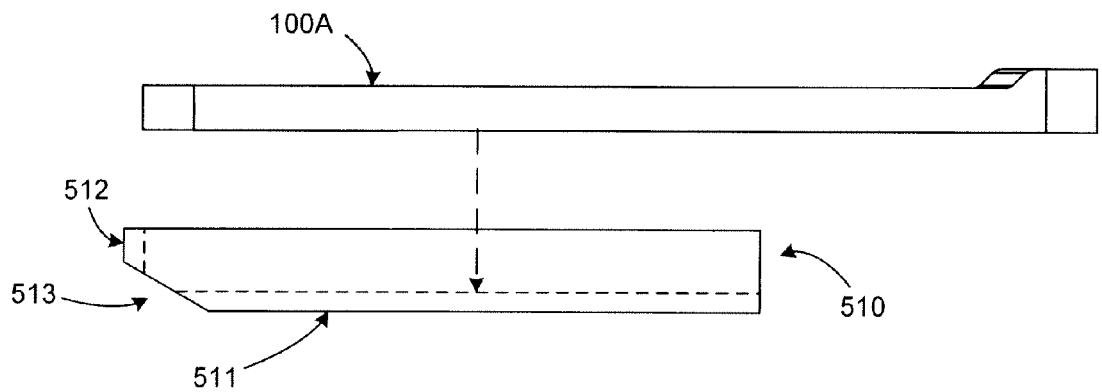
FIGS. 19(A), 19(B) and 19(C) are simplified cross-sectional side views depicting a grinding process for providing a chamfer on the MicroSDs according to the method of FIG. 3.
Figure 19B:
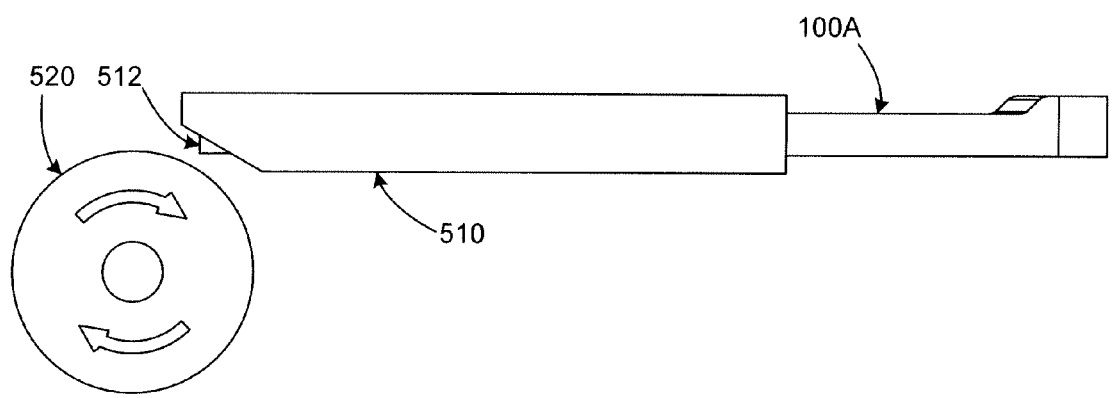
Figure 19C:
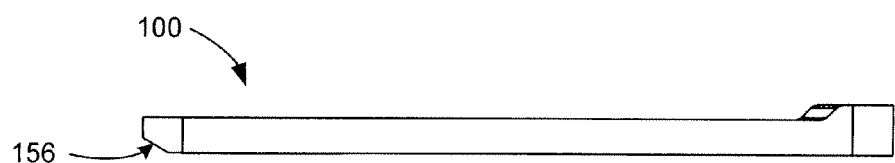

FIGS. 19(A) to 19(C) are simplified side views showing a chamfer process according to block 265 of FIG. 3, which is performed as a final processing step to individual MicroSD devices 100A (see FIG. 18) that have been singulated from their PCB panel. FIG. 19(A) shows a device 100A positioned over a fixture 510 having a lower wall 511 and a front wall 512 that define a front corner opening 513. As indicated in FIG. 19(B), when device 100A is mounted onto fixture 510, a front corner portion of device 100A extends through opening 513. A grinding wheel or belt 520 is then used to remove the front corner portion, thereby forming the desired chamfer surface 156 on MicroSD device 100, which is shown in FIG. 19(C).

Figure 20:
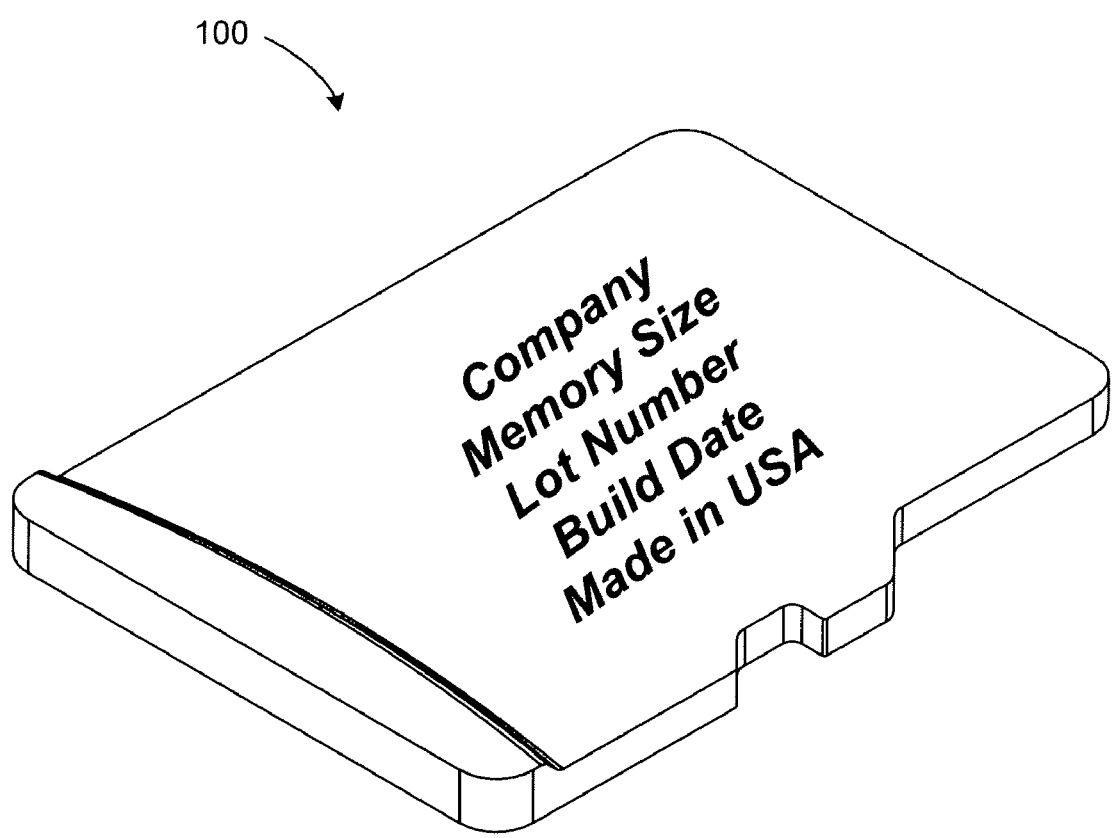
FIG. 20 is simplified top view showing process of marking the MicroSD devices according to the method of FIG. 3.

FIG. 20 is a perspective bottom view showing a MicroSD device 100 after singulation and chamfering, and further showing a marking process in accordance with block 270 of the method of FIG. 3. The singulated and completed MicroSD devices 100 undergo a marking process in which a designated company's name/logo, speed value, density value, or other related information are printed on surface 152 of housing 150. After marking, MicroSD devices 100 are placed in the baking oven to cure the permanent ink.

Referring to block 280 located at the bottom of FIG. 3, a final procedure in the manufacturing method of the present invention involves testing, packing and shipping the individual MicroSD devices. The marked MicroSD devices 100 shown in FIG. 20 are then subjected to visual inspection and electrical tests consistent with well established techniques. Visually or/and electrically test rejects are removed from the good population as defective rejects. The good memory cards are then packed into custom made boxes which are specified by customers. The final packed products will ship out to customers following correct procedures with necessary documents.

As suggested in the above example, in addition to reducing overall manufacturing costs by utilizing unpackaged controller and flash memory dies (i.e., by eliminating the packaging costs associated with SMT-ready controller and flash memory devices), the present invention provides a further benefit of facilitating greatly expanded memory capacity without increasing the overall size of MicroSD device 100, e.g., by facilitating a stacked-memory MicroSD device in which a first flash memory chip is mounted on the PCB and connected by first wire bonds, and a second flash memory chip is mounted on the first memory chip and connected by a second set of wire bonds to the PCB. Because the IC die height (thickness) D is much smaller than packaged flash memory devices, and because the thickness of the MicroSD device is set by predetermined standards, the present invention facilitates such a stacked memory arrangement that greatly increases memory capacity without increasing the footprint of the MicroSD device.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for producing a plurality of MicroSD devices, the method comprising:
    producing a printed circuit board (PCB) panel including a plurality of PCBs arranged in a plurality of rows, wherein all of said PCBs have a first width, and wherein at least one said PCB in each row is connected to a first adjacent PCB by a first connecting bridge structure and to a second adjacent PCB by a second connecting bridge structure, wherein the first and second connecting bridge structures have a second width that is narrower than the first width, and wherein the PCB panel defines a plurality of elongated stamped blank slots defined on the sides of each row such that side edges of each said PCB are exposed,
    attaching at least one passive component and at least one integrated circuit to each said PCB;
    forming a single-piece molded housing on a second surface of the PCB such that said at least one passive component and said at least one one IC die are covered by said molded housing, and portions of said molded housing cover said side edges of each said PCB, wherein said first connecting bridge structure and said second connecting bridge structure extend from opposite ends of the molded housing formed on said at least one said PCB in each row; wherein forming said single-piece molded housing comprises disposing said PCB panel into a first molding die including a plurality of raised island structures, each raised island structure being received inside a corresponding one of said elongated stamped blank slots such that a predetermined gap is defined between each side edge of each said PCB and a corresponding facing wall of an adjacent raised island structure; and
    singulating said PCB panel after forming said single-piece molded housings by cutting said first and second bridge structures using a rotating blade, thereby providing said plurality of MicroSD devices.

2. The method according to claim 1, wherein producing said PCB panel comprises stamping predetermined regions of a PCB sheet to form said plurality of elongated stamped blank slots such that a hook shape is formed on a first side edge of each said PCB and extends into a corresponding one of said elongated stamped blank slots.

3. The method according to claim 1, wherein said first molding die further comprises a plurality of alignment poles, and wherein disposing said PCB panel into said first molding die comprises operably engaging said alignment poles into corresponding alignment holes defined in said PCB panel.

4. The method according to claim 1, further comprising grinding a front edge of said each of said plurality of MicroSD devices to provide a chamfer thereon.

5. The method according to claim 1,
wherein producing said PCB panel comprises forming each said PCB to include opposing first and second surfaces, a plurality of metal contacts disposed on the first surface, a plurality of first contact pads disposed on the second surface, a plurality of second contact pads disposed on the second surface, and a plurality of conductive traces formed on the PCB such that each conductive trace is electrically connected to at least one of an associated metal contact, a first contact pad and a second contact pad; and
wherein attaching said at least one passive component and said at least one integrated circuit to each said PCB comprises:
attaching said at least one passive component to the first contact pads using a surface mount technique, and
attaching said at least one unpackaged integrated circuit (IC) die to the second contact pads using a chip-on-board technique.

6. The method of claim 5, wherein attaching said at least one passive component comprises:
printing a solder paste on said first contact pads;
mounting said at least one component on said first contact pads; and
reflowing the solder paste such that said at least one component is fixedly soldered to said first contact pads.

7. The method of claim 6, further comprising grinding a wafer including said at least one IC die such that a thickness of said wafer is reduced during said grinding, and then dicing said wafer to provide said at least one IC die.

8. The method of claim 7, wherein attaching at least one IC die comprises bonding said at least one IC die to the second surface of the PCB and wire bonding the at least one IC die to said second contact pad.

* * * * *